(12) United States Patent
Chen et al.

(10) Patent No.: US 12,224,224 B2
(45) Date of Patent: Feb. 11, 2025

(54) PACKAGE STRUCTURE WITH METALLIC LAYER OVER THE SURFACES OF A PLURALITY OF SEMICONDUCTOR DIES

(71) Applicant: Taiwan Semiconductor Manufacturing Company, Ltd., Hsinchu (TW)

(72) Inventors: Chih-Hao Chen, Taipei (TW); Po-Yuan Cheng, New Taipei (TW); Pu Wang, Hsinchu (TW); Li-Hui Cheng, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 368 days.

(21) Appl. No.: 17/693,444

(22) Filed: Mar. 14, 2022

(65) Prior Publication Data
US 2023/0290704 A1 Sep. 14, 2023

(51) Int. Cl.
*H01L 23/373* (2006.01)
*H01L 21/48* (2006.01)
*H01L 21/56* (2006.01)
*H01L 23/00* (2006.01)
*H01L 23/31* (2006.01)
(Continued)

(52) U.S. Cl.
CPC ...... *H01L 23/3736* (2013.01); *H01L 21/4857* (2013.01); *H01L 21/4871* (2013.01); *H01L 21/563* (2013.01); *H01L 23/3107* (2013.01); *H01L 23/49822* (2013.01); *H01L 23/5381* (2013.01); *H01L 24/32* (2013.01); *H01L 25/0657* (2013.01); *H01L 2224/32225* (2013.01); *H01L 2924/181* (2013.01)

(58) Field of Classification Search
CPC .......... H01L 23/49822; H01L 23/3736; H01L 23/3107; H01L 23/5381; H01L 25/0657; H01L 21/4871; H01L 21/563; H01L 21/4857; H01L 2924/181; H01L 24/32
See application file for complete search history.

(56) References Cited

U.S. PATENT DOCUMENTS 8,993,380 B2 3/2015 Hou et al.
9,281,254 B2 3/2016 Yu et al.
(Continued)

*Primary Examiner* — Alonzo Chambliss
(74) *Attorney, Agent, or Firm* — JCIPRNET

(57) ABSTRACT

A package structure includes first and second package components, an underfill layer disposed between the first and second package components, and a metallic layer. The first package component includes semiconductor dies, a first insulating encapsulation laterally encapsulating the semiconductor dies, and a redistribution structure underlying first surfaces of the semiconductor dies and the first insulating encapsulation. The second package component underlying the first package component is electrically coupled to the semiconductor dies through the redistribution structure. The underfill layer extends to cover a sidewall of the first package component, the metallic layer overlying second surfaces of the semiconductor dies and the first insulating encapsulation, and a peripheral region of the second surface of the first insulating encapsulation is accessibly exposed by the metallic layer, where the first surfaces are opposite to the second surfaces. A manufacturing method of a package structure is also provided.

20 Claims, 22 Drawing Sheets

(51) Int. Cl.
*H01L 23/498* (2006.01)
*H01L 23/538* (2006.01)
*H01L 25/065* (2023.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,391,043 B2* | 7/2016 | Paek ................... H01L 23/3185 |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 10,297,466 B2* | 5/2019 | Do ........................ H01L 21/563 |
| 10,707,177 B2* | 7/2020 | Huang ................ H01L 23/3736 |
| 10,770,405 B2* | 9/2020 | Huang .................. H01L 21/565 |
| 11,075,133 B2* | 7/2021 | Chen .................... H01L 21/563 |
| 11,996,345 B2* | 5/2024 | Chen .................... H01L 21/6836 |
| 12,009,281 B2* | 6/2024 | Chen .................... H01L 23/3736 |
| 2012/0171814 A1* | 7/2012 | Choi .................... H01L 23/367 |
| | | 257/E21.504 |
| 2014/0131856 A1* | 5/2014 | Do ..................... H01L 23/5384 |
| | | 257/737 |
| 2018/0012881 A1* | 1/2018 | Scanlan ................. H01L 25/50 |
| 2018/0190638 A1* | 7/2018 | Chen .................. H01L 23/3128 |

\* cited by examiner

PACKAGE STRUCTURE WITH METALLIC LAYER OVER THE SURFACES OF A PLURALITY OF SEMICONDUCTOR DIES

BACKGROUND

As electronic products are continuously miniaturized, heat dissipation and warpage of a package structure have become the important issues for packaging technology. For example, a package structure includes a thermal conductive structure disposed between the back side of the semiconductor die and the lid. In such arrangement, thermal cycling can induce stress in the package structure, which can cause delamination and cracking, possibly leading to catastrophic failures. As a result, there is continuous effort in developing new mechanisms of forming package structures with better reliability and performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
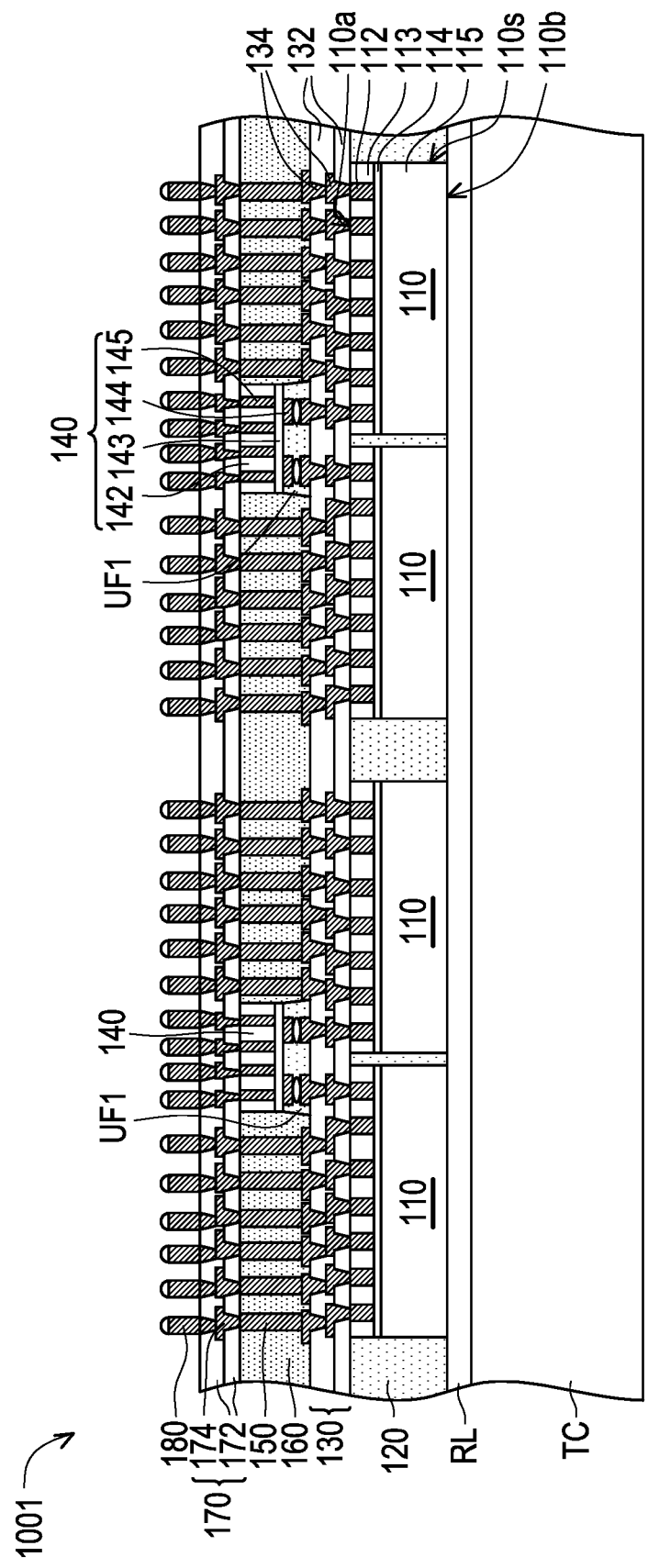
FIGS. 1A-1H are schematic cross-sectional views of various stages of manufacturing a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1H are schematic cross-sectional views of various stages of manufacturing a package structure, and FIGS. 2A-2D are schematic top views of the structures respectively corresponding to FIGS. 1E-1H, in accordance with some embodiments.

Referring to FIG. 1A, a plurality of first semiconductor dies 110 is disposed over a temporary carrier TC and laterally covered by a first insulating encapsulation 120. The temporary carrier TC may be a glass carrier, a ceramic carrier, a composite carrier, and/or the like. In some embodiments, the temporary carrier TC is provided in a wafer form, and the first semiconductor dies 110 are arranged in an array over the temporary carrier TC. In some embodiments, a release layer RL is formed on the temporary carrier TC to facilitate the removal of the temporary carrier TC that will be performed in subsequent steps. The release layer RL may include a polymer-based material which may lose its adhesive property when heated such as light-to-heat-conversion (LTHC) release material, ultra-violet (UV) glue, temporary adhesive, and/or the like.

The respective first semiconductor die 110 may include a first surface 110a, a second surface 110b opposite to the first surface 110a, and a sidewall 110s connected to the first surface 110a and the second surface 110b, where the second surface 110b of the respective first semiconductor die 110 may be adhered to the release layer RL. The first semiconductor dies 110 may be formed in a device wafer (not shown) which includes different die regions that are singulated to form a plurality of first semiconductor dies 110. After the singulation, the first semiconductor dies 110 are disposed on the release layer RL through a pick-and-place process. The respective first semiconductor die 110 may have a single function (e.g., a logic die, a processor die (e.g., a central processing unit (CPU) die, a graphics processing unit (GPU) die, an application-specific integrated circuit (ASIC) die, etc.), a memory die (e.g., a dynamic random-access memory (DRAM) die, a static random-access memory (SRAM) die, a stacked memory module, a high-bandwidth memory (HBM) die, etc.), a radio frequency die, a mixed signal die, a I/O die, combinations thereof, and/or the like). The first semiconductor die(s) 110 may trap heat and become hot spot(s) in the resulting package structure. In some embodiments, the first semiconductor dies 110 are of different sizes (e.g., footprint areas) and have different functions. For example, at least one of the first semiconductor dies 110 may be formed as a die stack having multiple functions (e.g., a system-on-chip or the like). For example, the first semiconductor die 110 includes an interface module which bridges the processor module to memory module and translates commands therebetween. Alternatively, the first semiconductor dies 110 may be of the same/similar dimension(s). Other types of semiconductor dies may be used depending on product requirements.

With continued reference to FIG. 1A, the first semiconductor die 110 includes a plurality of die connectors 112 (e.g., micro-bumps, metal pillars with or without caps, controlled collapse chip connection (C4) bumps, or the like) at the first surface 110a for further electrical connection. The respective first semiconductor die 110 may (or may not) include a protection layer 113 laterally covering the die connectors 112, an interconnecting layer 114 connected to the die connectors 112, and a semiconductor substrate 115 having active/passive devices (not shown) formed thereon. The interconnecting layer 114 may be formed over the semiconductor substrate 115 and electrically connect the die connectors 112 to the active/passive devices. The semiconductor substrate 115 may include a semiconductor material(s) including, but not limited to, bulk silicon, a silicon germanium substrate, silicon-on-insulator (SOI) substrate, or the like. Other semiconductor materials including group III, group IV, and group V elements may be used. It is noted that the configuration and the number of the first semiconductor dies 110 shown herein is merely for illustrative purposes, and any configuration and number of the first semiconductor dies may be employed depending on product requirements.

Still referring to FIG. 1A, the first insulating encapsulation 120 is formed over the temporary carrier TC and extends along the sidewall 110s of the respective first semiconductor die 110. In some embodiments, the first insulating encapsulation 120 is a mixture of a polymer-based material and fillers (or other additives). For example, the first insulating encapsulation 120 includes epoxy, epoxy with fillers, molding compound, or other suitable material. In some embodiments, an insulating material is formed on the release layer RL such that the first semiconductor dies 110 are buried (or covered). The insulating material may be formed by compression molding, transfer molding, injection molding, spin-on coating, or the like. The insulating material may be applied in liquid or semi-liquid form and then subsequently cured. Next, a planarization process may be performed on the insulating material to expose a least a portion of the die connectors 112 of the respective first semiconductor die 110. The planarization process may include chemical-mechanical polishing (CMP), grinding, etching, a combination thereof, and/or the like. After the planarization process, top surfaces of the protection layer 113, the die connectors 112, and the first insulating encapsulation 120 are substantially leveled (e.g., coplanar). Alternatively, the planarization process may be omitted.

With continued reference to FIG. 1A, a first redistribution structure 130 may be formed on the first semiconductor dies 110 and the first insulating encapsulation 120. The first redistribution structure 130 includes any number of alternately stacked patterned dielectric layers 132 and patterned conductive layers 134. The first redistribution structure 130 is shown as an example having two layers, but more or fewer patterned dielectric layers and patterned conductive layers may be formed in the first redistribution structure 130. The patterned dielectric layers 132 may be formed of a photosensitive material such as polybenzoxazole (PBO), polyimide (PI), benzocyclobutene (BCB), and/or the like. The patterned dielectric layers 132 may be deposited by spin-coating, lamination, CVD, the like, or a combination thereof, and may be patterned by lithography and etching, or the like, to form openings for further electrical connection. The patterned conductive layers 134 may include a seed material and a conductive material (e.g., Cu, Ti, Al, Au, Ag, metal alloy, and/or the like) formed on the seed material. The respective patterned conductive layer 134 includes portions on and extending along the major surface of the underlying patterned dielectric layer 132, and also includes portions extending through the underlying patterned dielectric layer 132 to physically and electrically couple the die connectors 112 or the underlying one of the patterned conductive layers 134. The patterned conductive layers 134 may be referred to as redistribution layers or redistribution lines.

Still referring to FIG. 1A, a plurality of second semiconductor dies 140 may be disposed over the first redistribution structure 130. For example, the respective second semiconductor die 140 is picked and placed on the first redistribution structure 130 and located above a gap between adjacent first semiconductor dies 110. The adjacent first semiconductor dies 110 may be electrically interconnected through the first redistribution structure 130 and the second semiconductor die 140 disposed above these adjacent first semiconductor dies 110. In some embodiments, the respective second semiconductor die 140 includes a semiconductor substrate 142, a connecting layer 143 connected to the semiconductor substrate 142, die connectors 144 connected to the connecting layer 143, and through substrate vias (TSVs) 145 penetrating through the semiconductor substrate 142 and connected to the connecting layer 143. The connecting layer 143 may (or may not) include a wide variety of active devices and/or passive device(s) and redistribution lines interconnecting those devices. The second semiconductor dies 140 may be disposed in a flip-chip manner and may be coupled to the topmost one of the patterned conductive layers 134 through, for example, conductive joints. In some embodiments, the second semiconductor die 140 is referred to as a bridge die for a shorter electrical connection path between the adjacent first semiconductor dies 110, where the bridge die is free of active and/or passive device(s).

In some embodiments, a first underfill layer UF1 is formed between the first redistribution structure 130 and the respective second semiconductor die 140. For example, a liquid organic material (e.g., epoxy mixture) is dispensed into the gap between the second semiconductor die 140 and the first redistribution structure 130, and then a curing process is performed to form the first underfill layer UF1. The first underfill layer UF1 may cover the die connectors 144 of the second semiconductor die 140 and the topmost one of the patterned conductive layers 134, thereby strengthening the attachment and helping to prevent the thermal stresses from breaking the connection therebetween. Alternatively, the first underfill layer UF1 is omitted. In some embodiments, a plurality of through interlayer vias (TIVs) 150 is formed over the first redistribution structure 130 and surrounds the respective second semiconductor die 140. The TIVs 150 may include any suitable conductive material (e.g., Cu, Ti, Ni, Sn, metal alloy, a combination thereof, or the like). The TIVs 150 may be electrically coupled to the first semiconductor dies 110 through the patterned conductive layers 134 of the first redistribution structure 130. It is appreciated that the number and the locations of the TIVs 150 are variable and may be modified in demand.

With continued reference to FIG. 1A, a second insulating encapsulation 160 may be formed on the first redistribution structure 130 and may laterally cover the TIVs 150, the second semiconductor dies 140, and the first underfill layer UF1. The material and the forming process of the second insulating encapsulation 160 may be the same as or similar to those of the first insulating encapsulation 120. After the planarization process, top surfaces of the TIVs 150, top surfaces of TSVs 145 of the second semiconductor dies 140, and a top surface of the second insulating encapsulation 160 may be substantially leveled (e.g., coplanar), within process variations. In some embodiments, a second redistribution structure 170 is formed on the TIVs 150, the second semiconductor dies 140, and the second insulating encapsulation 160. The second redistribution structure 170 may include any number of alternately stacked patterned dielectric layers 172 and patterned conductive layers 174. The patterned conductive layers 174 may be electrically coupled to the TSVs 145 of the second semiconductor dies 140 and the TIVs 150. The patterned conductive layers 174 may also be referred to as redistribution layers or redistribution lines. The materials and the forming processes of the second redistribution structure 170 may be similar to those of the first redistribution structure 130, so the detailed descriptions are not repeated for the sake of brevity.

In some embodiments, a plurality of conductive terminals 180 is formed on the second redistribution structure 170. The conductive terminals 180 may be or may include metal pillars, micro-bumps, C4 bumps, solder balls, electroless nickel-electroless palladium-immersion gold (ENEPIG) bumps, ball grid array (BGA) connectors, or the like. A method of forming the conductive terminals 180 may include at least the following steps. A mask layer (not shown) having a plurality of openings may be formed on the second redistribution structure 170. The openings of the mask layer may expose the intended locations of the second redistribution structure 170 for the subsequently formed conductive terminals 180. Next, a plating process (or any suitable deposition process) may be performed in the openings of the mask layer to form the pillar portions that have vertical sidewalls and are in physical and electrical contact with the underlying patterned conductive layer 174. Next, a solder material may be formed on the pillar portions to form the cap portions using any suitable method (e.g., evaporation, plating, printing, solder transfer, ball placement, etc.). Afterwards, the mask layer is removed, and a reflow process is optionally performed on the solder material to shape into the desired bump shape.

Figure 1B:
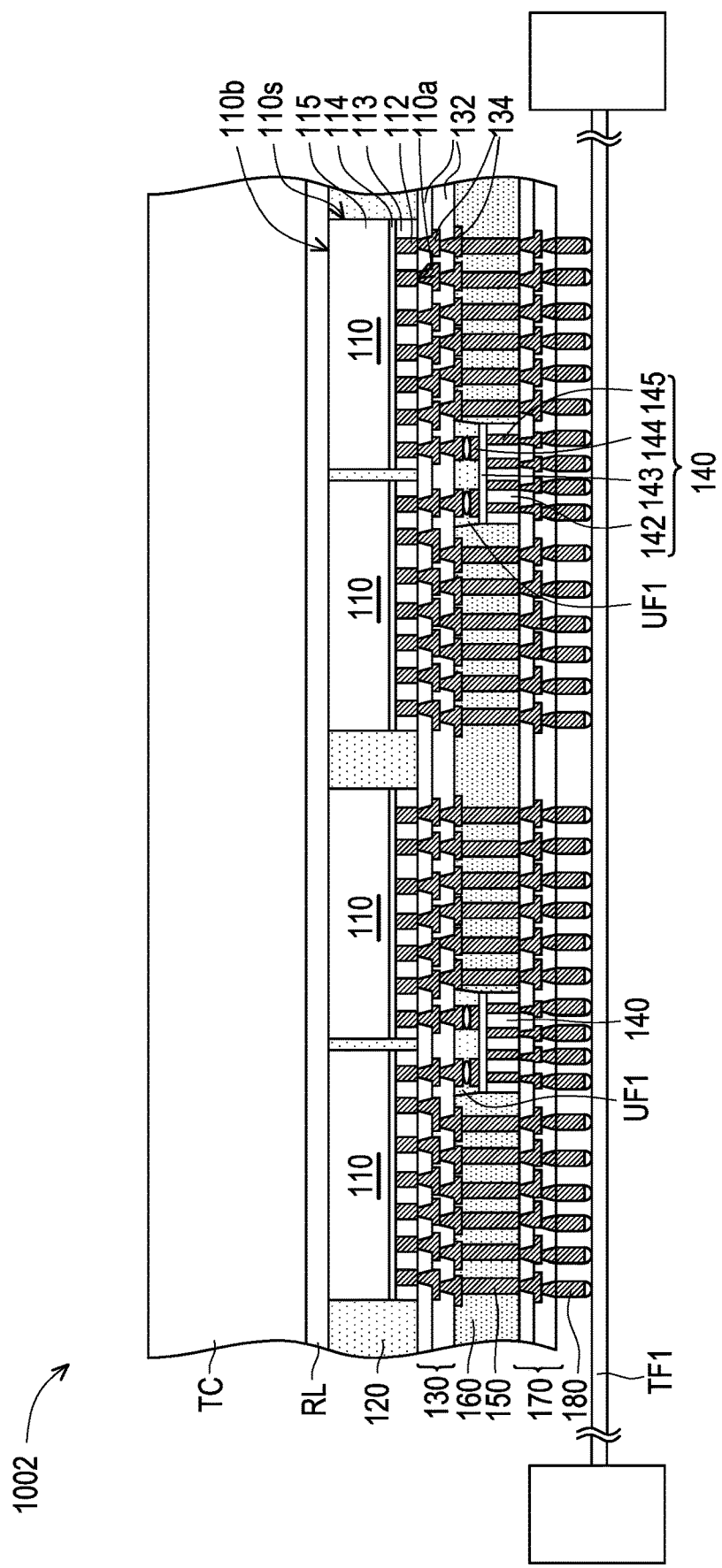
Figure 1C:
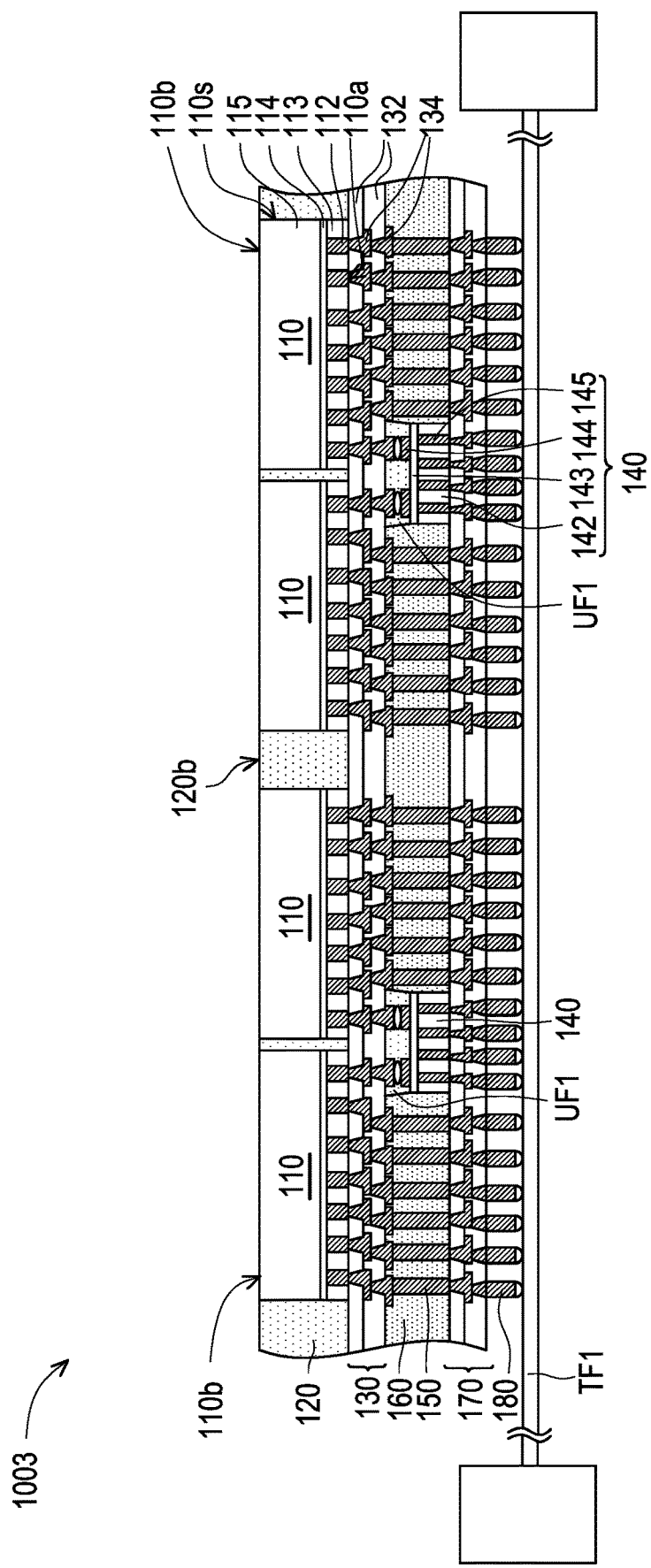

Referring to FIGS. 1B-1C and with reference to FIG. 1A, the resulting structure 1001 shown in FIG. 1A may be flipped upside-down and then mounted on a tape frame TF1 to form the resulting structure 1002. For example, the conductive terminals 180 are attached to the tape of the tape frame TF1. Subsequently, the temporary carrier TC may be removed through a de-bonding process. For example, a light (e.g., laser or UV light) is projected on the release layer RL so that the release layer RL may decompose under the heat of the light and the temporary carrier TC and the release layer RL may be removed. After de-bonding the temporary carrier TC, the resulting structure 1003 is formed, where the second surfaces 110b of the first semiconductor dies 110 and a major surface 120b of the first insulating encapsulation 120 are accessibly exposed. It is understood that during the foregoing manufacturing process, the temporary carrier TC and the structure formed thereon has warpage due to coefficient of Thermal Expansion (CTE) mismatch. By mounting the resulting structure 1003 of FIG. 1C on the tape frame TF1 prior to the de-bonding process of the temporary carrier TC, negative impacts caused by the warpage during the de-bonding process may be reduced or eliminated.

Figure 1D:
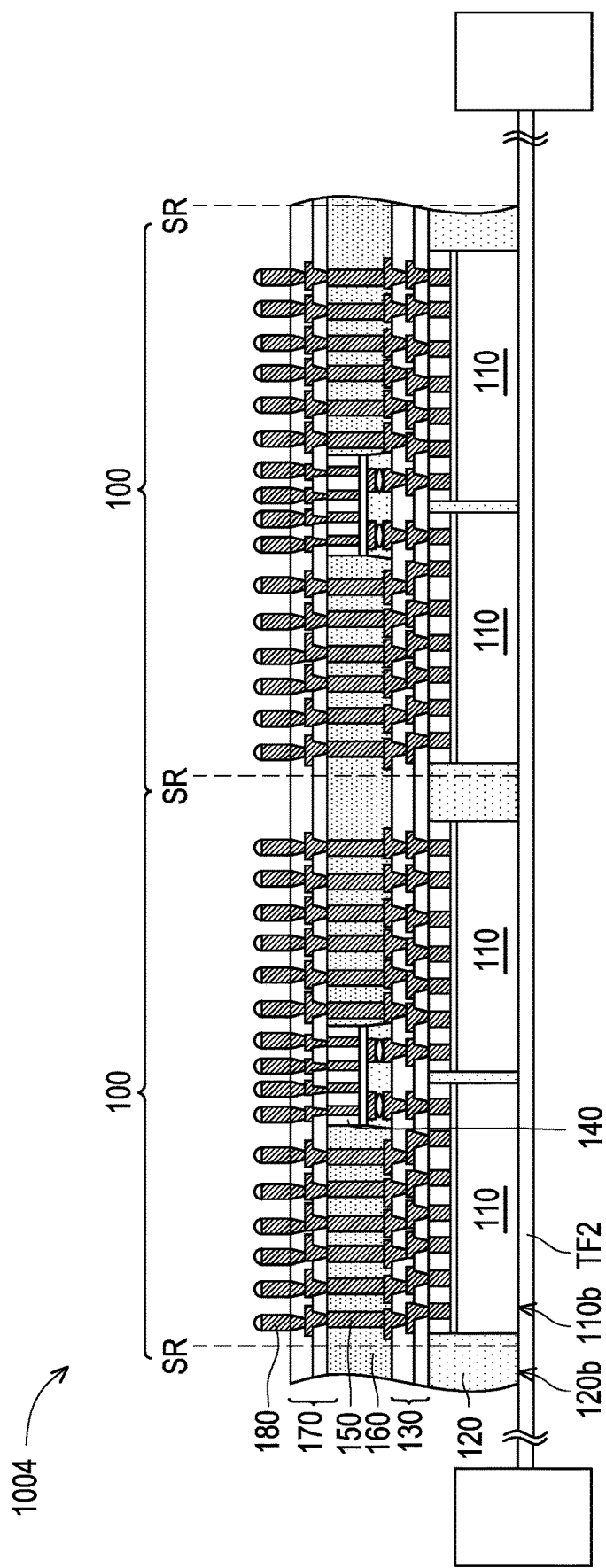

Referring to FIG. 1D and with reference to FIG. 1C, the resulting structure 1003 shown in FIG. 1C may be removed from the tape frame TF1 and then flipped upside-down to be mounted on a dicing tape frame TF2 to form the resulting structure 1004. For example, the second surfaces 110b of the first semiconductor dies 110 and the major surface 120b of the first insulating encapsulation 120 are placed on the tape of the dicing tape frame TF2. The dicing tape frame TF2 may be similar to the tape frame TF1. After mounting on the dicing tape frame TF2, a singulation process may be performed by sawing along scribe line regions SR to separate the first package components 100 from one another. For example, the sawing includes cutting off the second redistribution structure 170, the second insulating encapsulation 160, the first redistribution structure 130, and the first insulating encapsulation 120 to render a conterminous sidewall of the first package component 100.

Figure 1E:
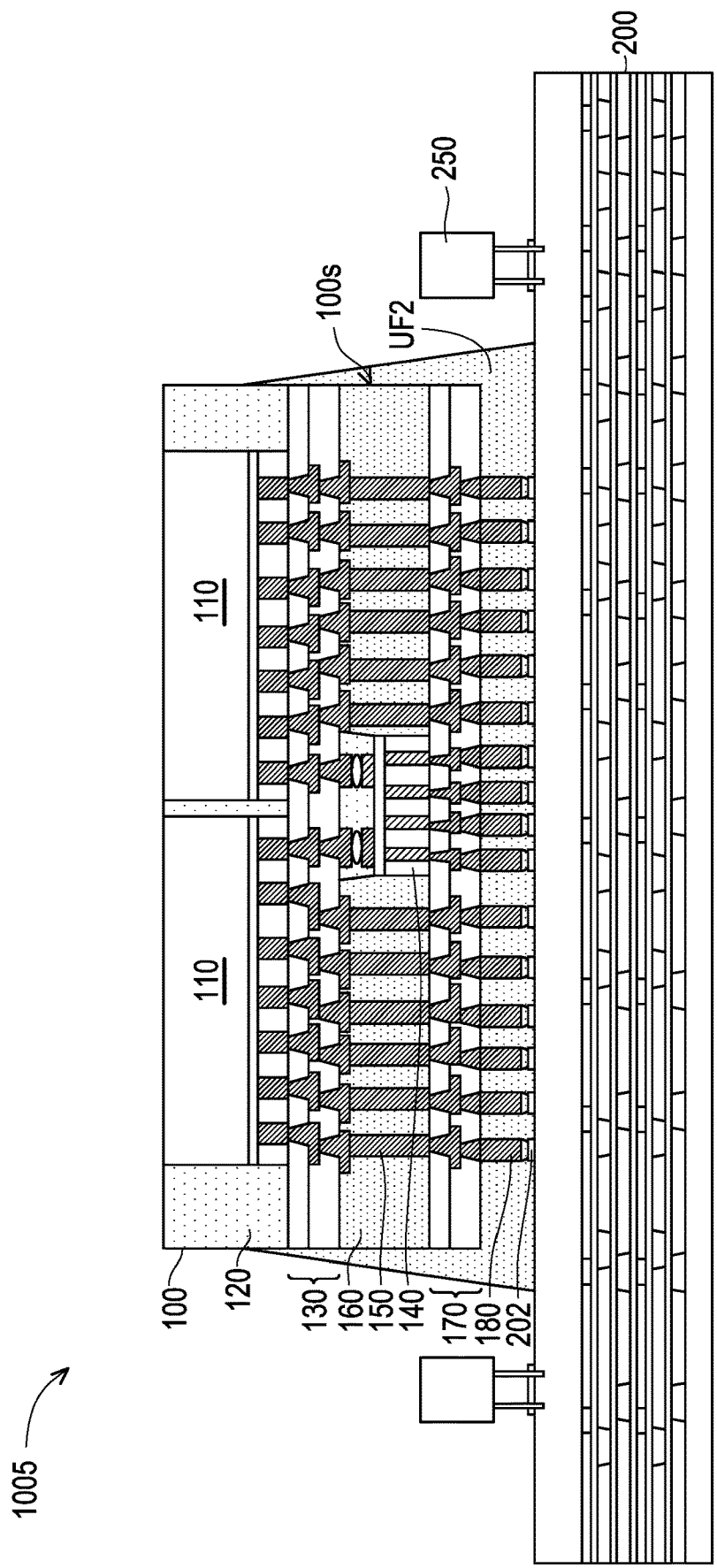

Referring to FIG. 1E, the first package component 100 may be disposed on and coupled to a second package component 200. For example, the conductive terminals 180 are placed on bond pads 202 of the second package component 200, and then a reflow process is performed to form conductive joints coupling the first package component 100 and the second package component 200. The first semiconductor dies 110 in the first package component 100 may be electrically coupled to the second package component 200 through the conductive joints. The second package component 200 may be or may include a printed circuit board (PCB), a package substrate, a silicon interposer, a silicon substrate, an organic substrate, a ceramic substrate, a combination thereof, and/or the like. It is noted that any circuit/redistributive substrate that provides support and connectivity are fully intended to be included within the scope of the embodiments. In some embodiments, a second underfill layer UF2 is formed in a gap between the first package component 100 and the second package component 200 to surround the conductive joints, the conductive terminals 180, and the bond pads 202. The second underfill layer UF2 may be formed by a capillary flow process or any suitable deposition method. For example, the second underfill layer UF2 extends to partially or fully cover the sidewall 100s of the first package component 100.

Figure 2A:
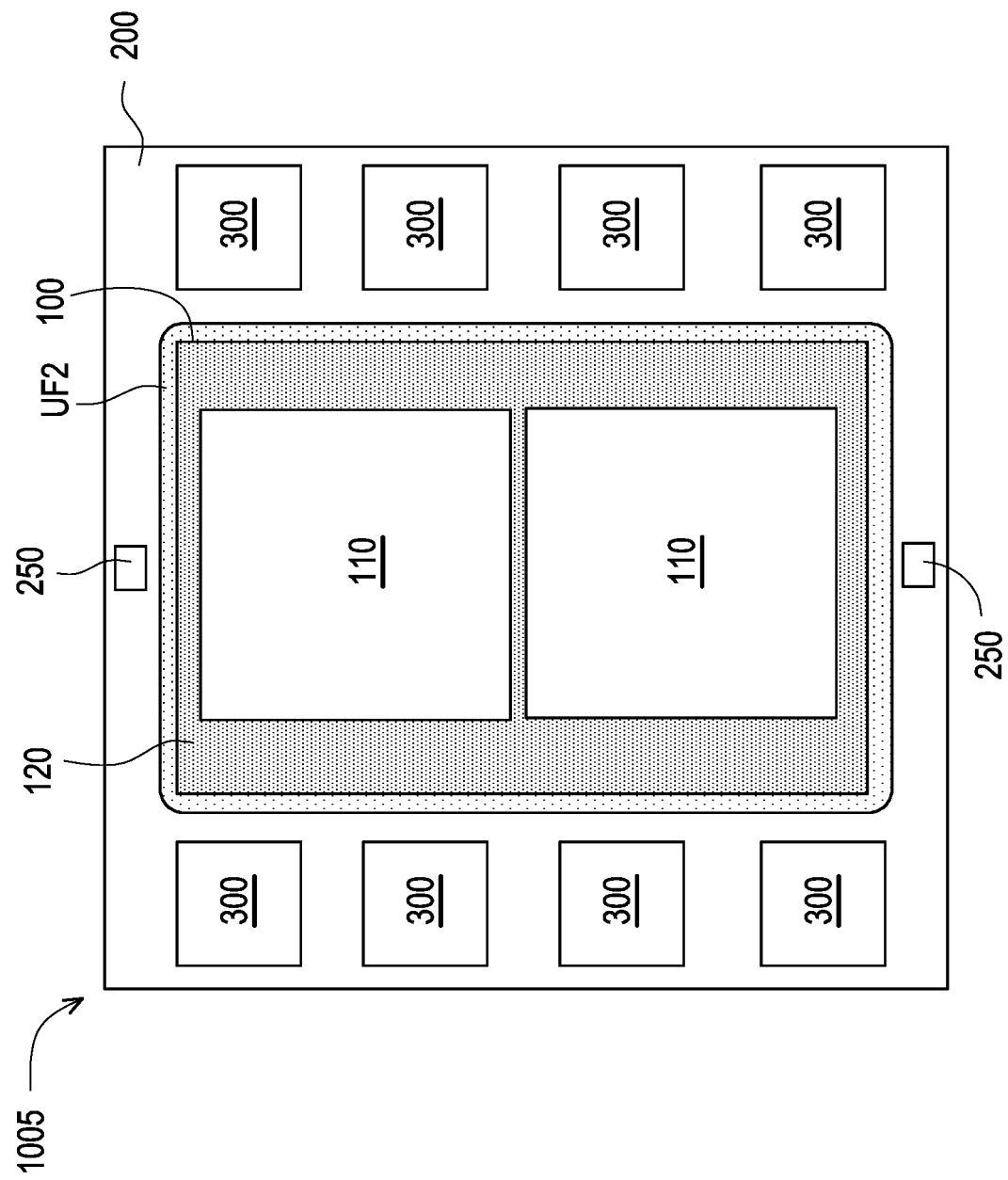
FIGS. 2A-2D are schematic top views of the structures respectively corresponding to FIGS. 1E-1H in accordance with some embodiments.

With continued reference to FIG. 1E and referring to the top view of FIG. 2A, a plurality of passive components 250 is mounted on the second package component 200 and disposed adjacent the first package component 100. In some embodiments, a plurality of third package component 300 may be mounted on the second package component 200 and arranged in an array at two opposing sides of the first package component 100. For example, the third package components 300 may be or may include memory modules/packages that are electrically coupled to the first semiconductor dies 110 in the first package component 100 through the second package component 200. The third package components 300 may be or may include any suitable type of devices/packages, depending on product requirements. It is noted that the number and the configuration of the passive components 250 and the third package component 300 shown in FIGS. 1E and 2A are merely an example and construe no limitation in the disclosure.

Figure 1F:
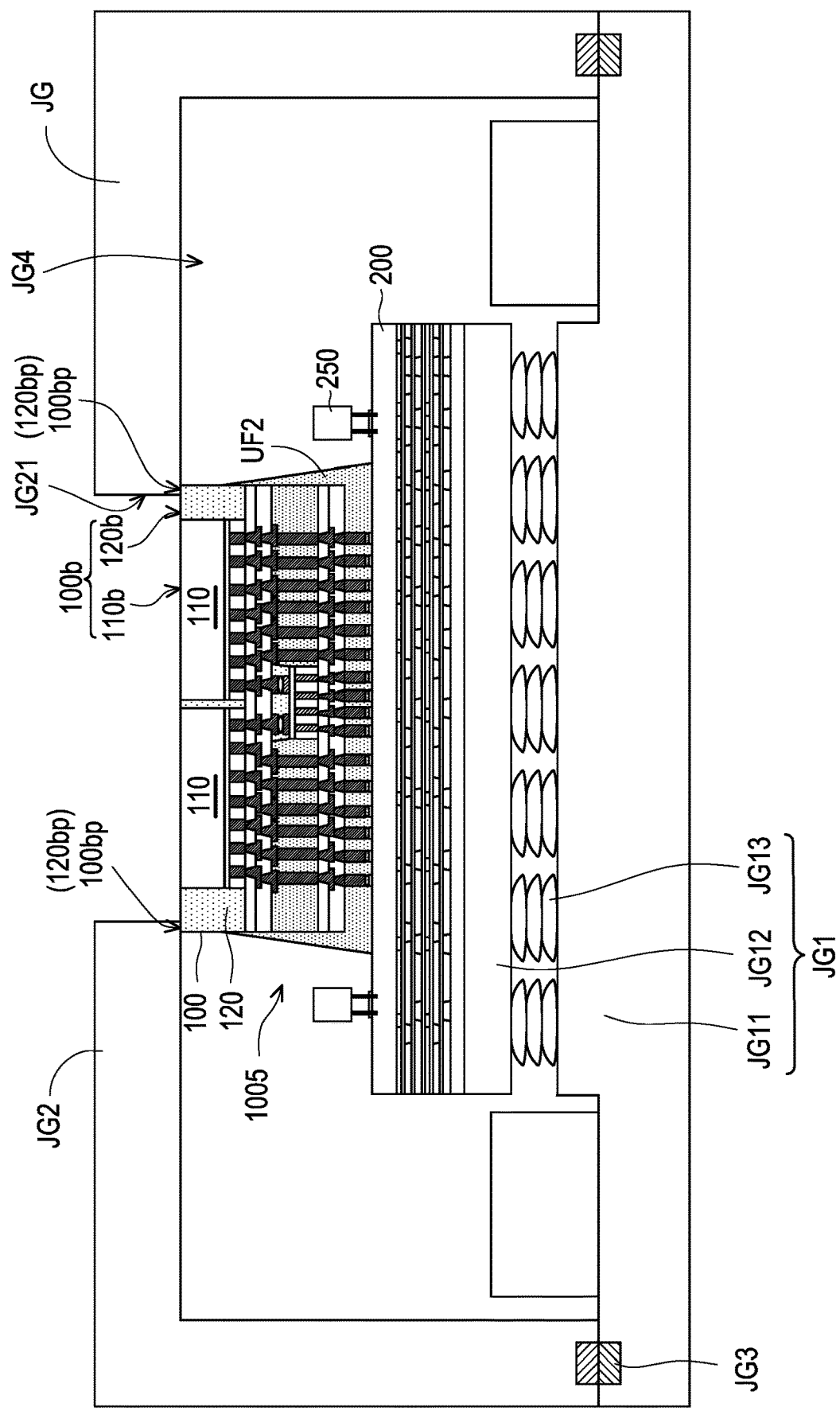
Figure 2B:
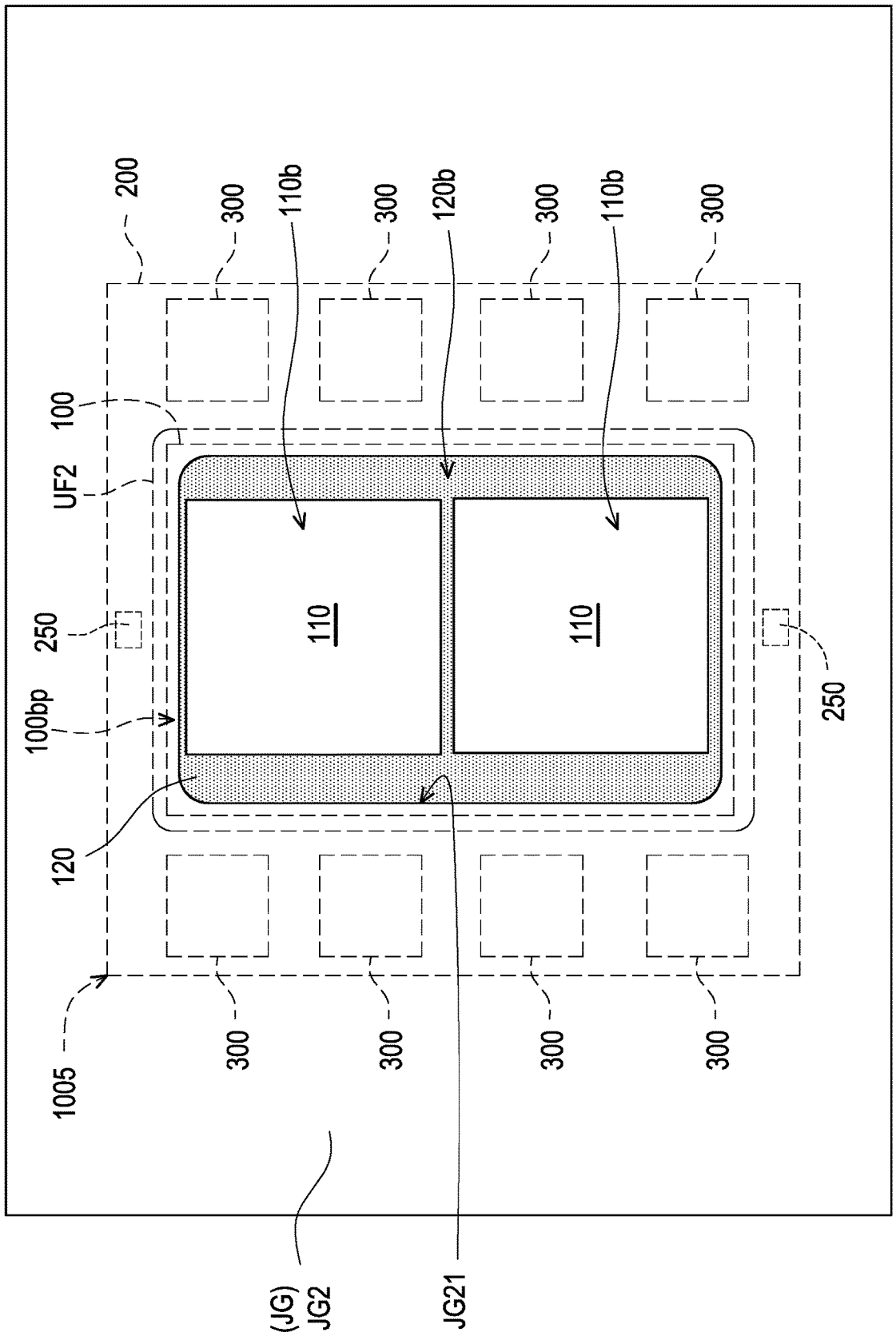

Referring to FIG. 1F and FIG. 2B, the resulting structure 1005 shown in FIG. 1E may be placed in a jig JG for processing on the first package component 100. For example, the jig JG includes a bottom portion JG1 and a cover portion JG2 engaged with the bottom portion JG1 through an engaging mechanism JG3 (e.g., magnets, screws and bolts, etc.). The bottom portion JG1 may include a base plate JG11 and a carrying plate JG12 coupled to the base plate JG11 through elastic members JG13, where the elastic members JG13 may be or may include springs, buffer materials, and/or the like. The bottom portion JG1 and the cover portion JG2 may form a cavity JG4, and the resulting structure 1005 of FIG. 1E is adapted to be disposed on the carrying plate JG12 within the cavity JG4. In some embodiments, the bottom portion JG1 and/or the cover portion JG2 may be substantially a single frame including one window exposing the areas exposed for one side of the resulting structure 1005. For example, the cover portion JG2 is provided with a window JG21. Various combinations of windows for the cover portion JG2 are contemplated within other embodiments. The second package component 200 may be disposed on the carrying plate JG12 of the bottom portion JG1 within the cavity JG4, and once the cover portion JG2 of the jig JG is disposed in place, the upper surface 100b of the first package component 100 including the second surfaces 110b of the first semiconductor dies 110 and the major surface 120b of the first insulating encapsulation 120 is accessibly exposed by the window JG21.

In some embodiments, the window JG21 of the jig JG has an area tolerance between the periphery of the area exposed by the window JG21 and the periphery of the first package component 100. The orthographic projection area of the window JG21 of the jig JG may be less than that of the upper surface 100b of the first package component 100. For example, the upper surface 100b of the first package component 100 is partially exposed by the window JG21, where a peripheral region 100bp of the upper surface 100b of the first package component 100 is covered by the cover portion JG2 of the jig JG. For example, the second surfaces 110b of the first semiconductor dies 110 are fully exposed by the window JG21 of the jig JG, while the peripheral region 120bp of the major surface 120b of the first insulating encapsulation 120 is in physical contact with the cover portion JG2 of the jig JG so that the peripheral region 120bp of the major surface 120b is shielded by the cover portion JG2. Other components (e.g., the second package component 200, the passive component 250, the third package components 300, and the second underfill layer UF2) may also be shielded by the cover portion JG2 of the jig IG for protection. The top-view shape of the window JG21 may be substantially rectangular without straightedge corners, e.g., curved corners or corners having round-shaped edges. In alternative embodiments, the top-view shape of the window JG21 is oval, polygonal, irregular, or the like, as long as the window JG21 can accessibly expose the second surfaces 110b of the first semiconductor dies 110.

Figure 1G:
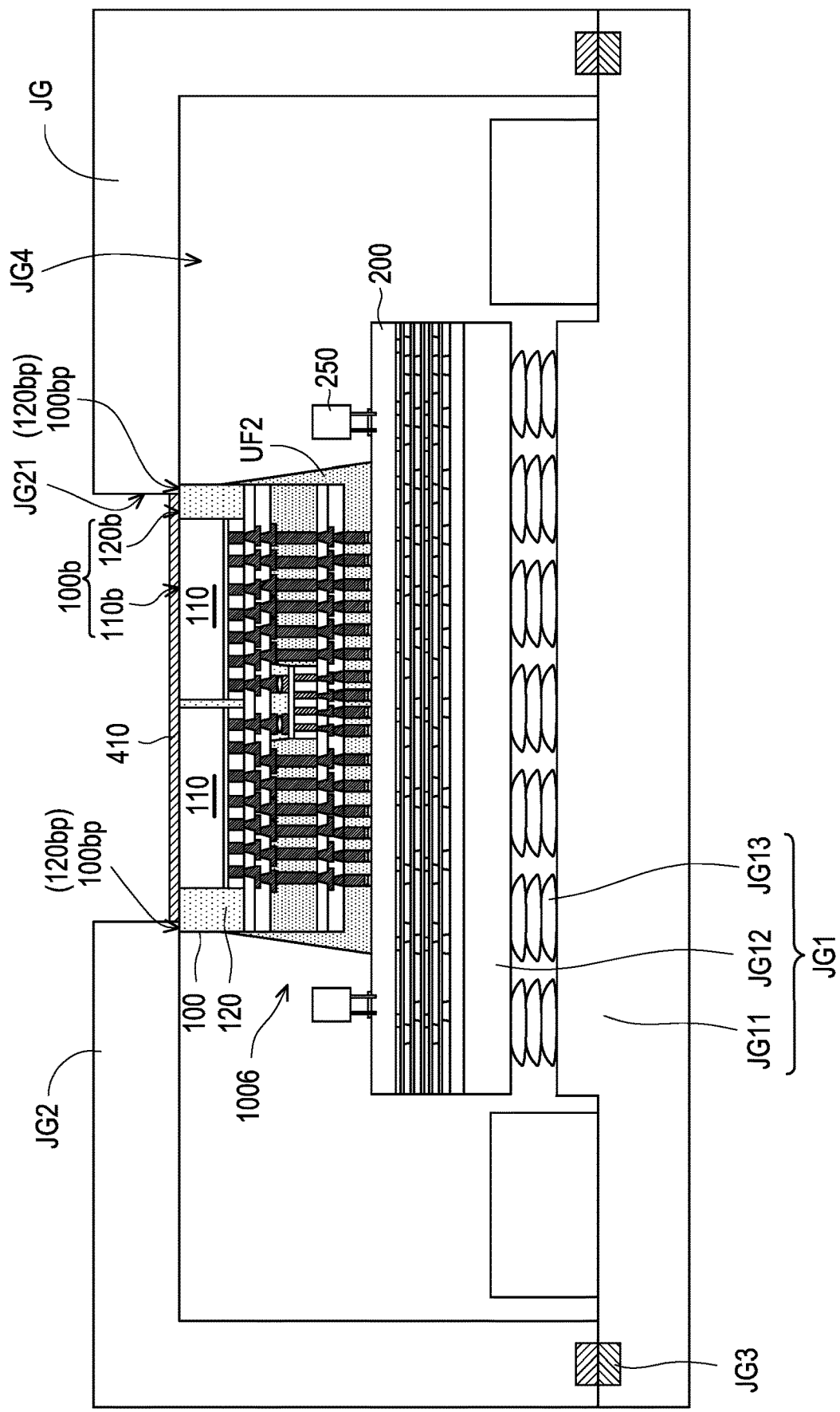
Figure 1H:
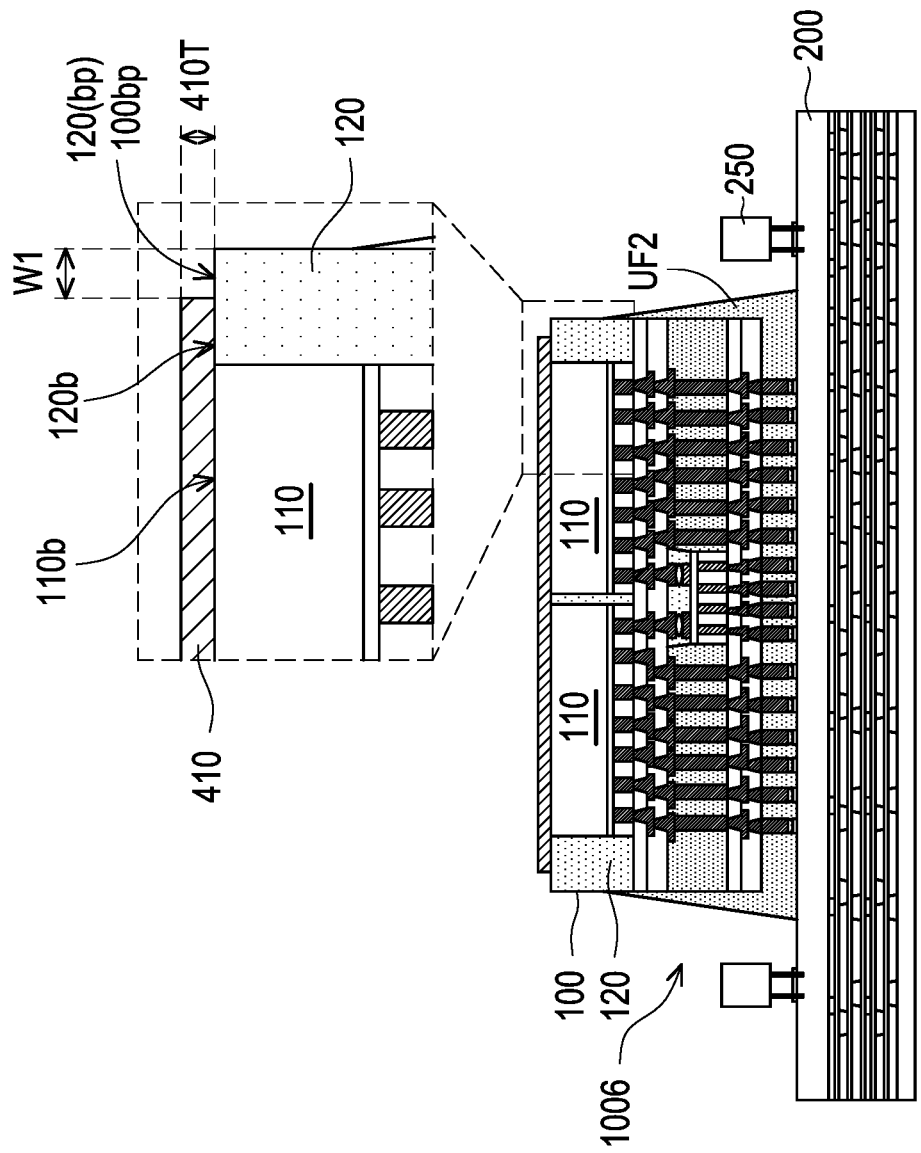
Figure 2C:
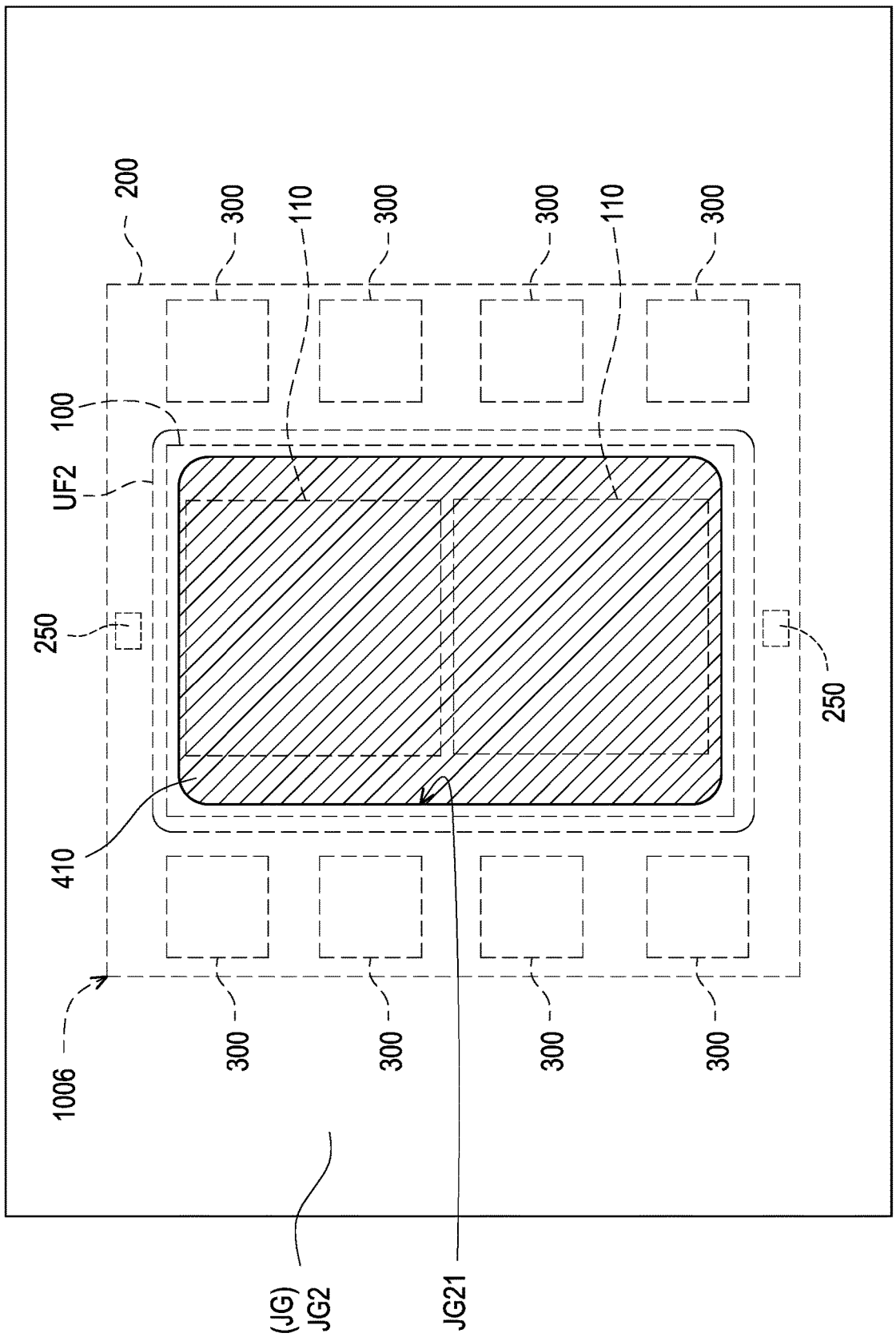

Referring to FIGS. 1G-1H and FIG. 2C, a metallic layer 410 may be formed inside the window JG21 of the cover portion JG2, and may be formed on the upper surface 100b of the first package component 100 that is accessibly exposed by the window JG21 of the cover portion JG2. For example, the metallic layer 410 includes any suitable conductive material (e.g., Al, Ti, TiN, Ni, NiV, Au, Ag, Cu, stainless steel, metal alloy, a combination thereof, and/or the like), and may be formed by any suitable process (e.g., sputtering, printing, plating, and/or the like). For example, the metallic layer 410 is in direct contact with the second surfaces 110b of the first semiconductor dies 110 and the major surface 120b of the first insulating encapsulation 120, except for the peripheral region 120bp of the major surface 120b of the first insulating encapsulation 120 that is shielded by the cover portion JG2. Once the metallic layer 410 is formed, the resulting structure 1006 may be released from the jig JG as shown in FIG. 1H.

Figure 2D:
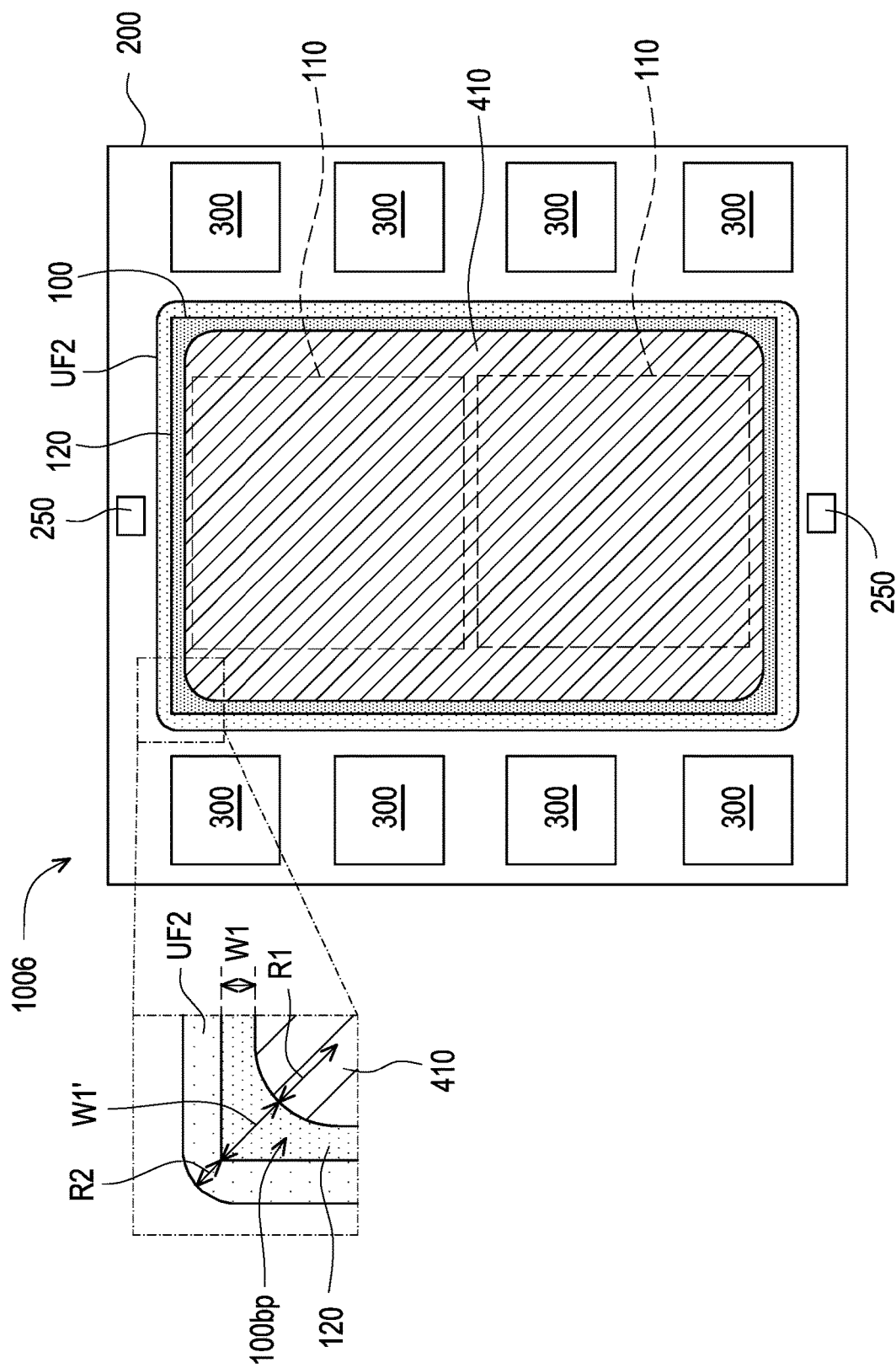

With continued reference to FIG. 1H and referring to FIG. 2D, the resulting structure 1006 includes the metallic layer 410 physically covering the first semiconductor dies 110 and a portion of the first insulating encapsulation 120, where the peripheral region 120bp of the first insulating encapsulation 120 remains accessibly exposed. For example, the thickness 410T of the metallic layer 410 is in a range of about 0.1 µm to about 5 µm. The width (or the lateral dimension) W1 of the peripheral region 120bp of the first insulating encapsulation 120, which is also the peripheral region 100bp of the first package component 100, is in a range of about 0.001 mm to about 1 mm. The width W1 may be greater than the thickness 410T of the metallic layer 410. Alternatively, the width W1 is substantially equal to (or less than) the thickness 410T of the metallic layer 410. In the top view, the peripheral region 120bp of the first insulating encapsulation 120 may have different widths. For example, in the top view, the width W1 is a shortest distance between the side of the first insulating encapsulation 120 and the side of the metallic layer 410, and the width W1' is a shortest distance between a corner at the intersection between two adjacent sides of the first insulating encapsulation 120 and a corner at the intersection between two adjacent sides of the metallic layer 410, where the width W1' may be greater than the width W1.

In the top view of FIG. 2D, the metallic layer 410 is encircled by the first insulating encapsulation 120 of the first package component 100, and the first insulating encapsulation 120 is encircled by the second underfill layer UF2. That is, the boundary of the first insulating encapsulation 120 is interposed between the boundary of the second underfill layer UF2 and the boundary of the metallic layer 410. In some embodiments, the metallic layer 410 and the second underfill layer UF2 have the same (or similar) top-view shape. The top-view shape of the first insulating encapsulation 120 may be different from the top-view shape of the second underfill layer UF2 (or the metallic layer 410). Alternatively, the top-view shape of the first insulating encapsulation 120 may also be the same as (or similar to) the top-view shape of the second underfill layer UF2 (or the metallic layer 410). As shown in the enlarged top view outlined in FIG. 2D, the top-view shape of the metallic layer 410 is rectangular with rounded corners, where the radius of curvature R1 of the round corner is illustrated. The top-view shape of the second underfill layer UF2 may also be a rectangular with rounded corners, where the radius of curvature R2 of the round corner is illustrated. The value of the radius of curvature R1 may vary from about 0.1 mm to about 4 mm. In some embodiments, the radius of curvature R1 is greater than the radius of curvature R2 of the second underfill layer UF2. Alternatively, the radius of curvature R1 is substantially equal to (or less than) the radius of curvature R2.

Figure 5A:
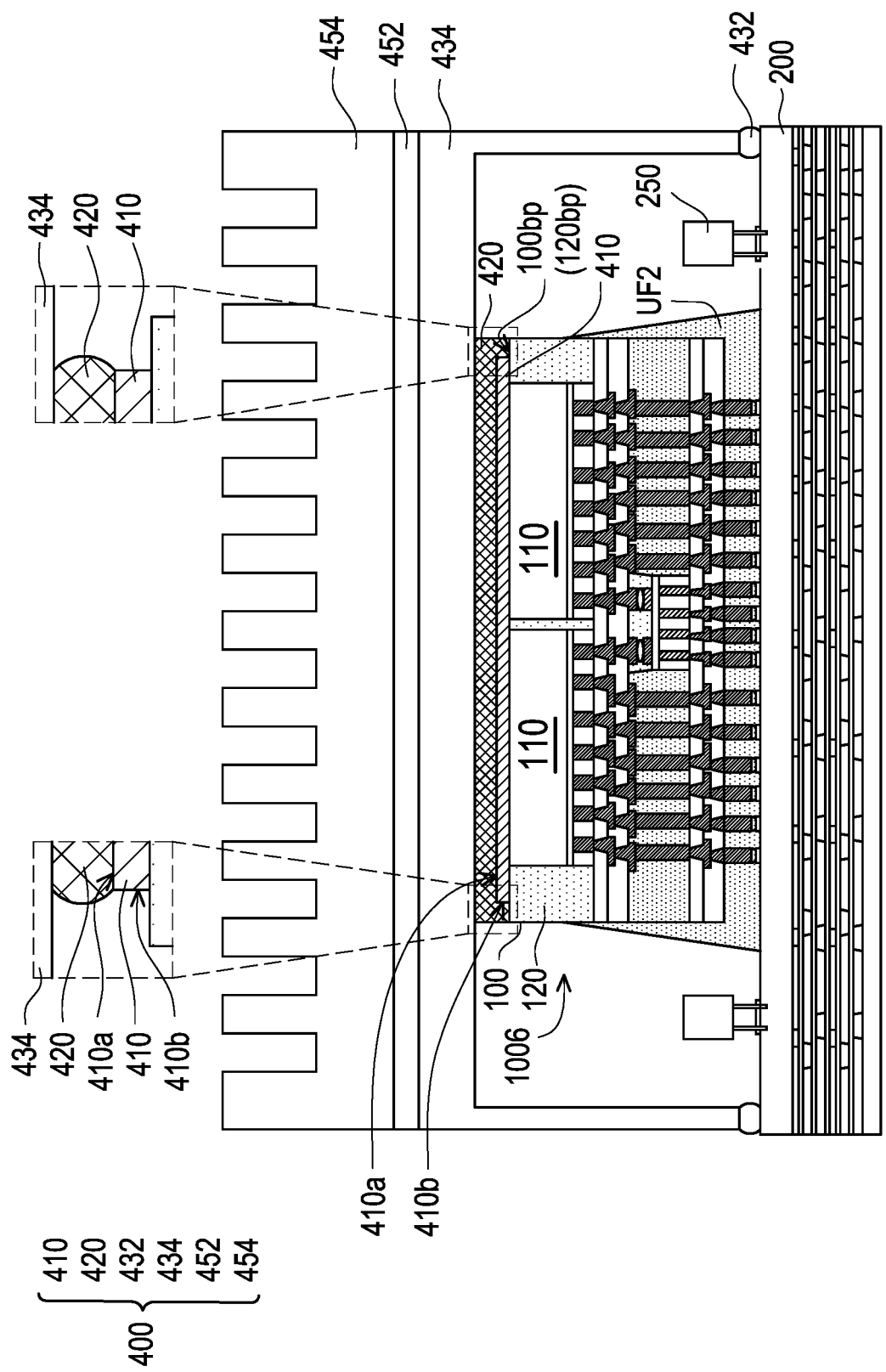
FIG. 5A-5C are schematic cross-sectional views of a package structure in accordance with some embodiments.
Figure 5B:
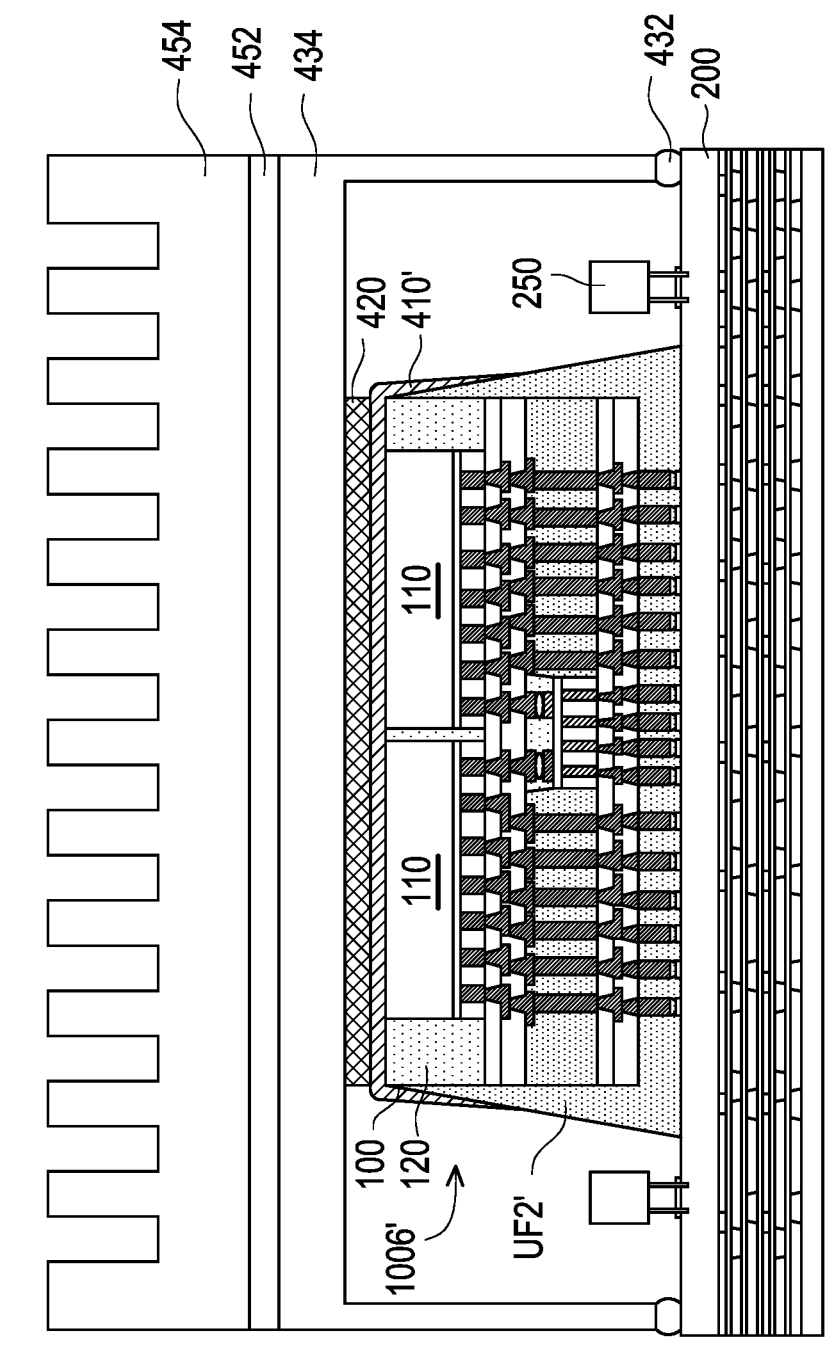

The metallic layer 410 physically coupled to the first semiconductor dies 110 of the first package component 100 may provide highly efficient thermal conductivity. The metallic layer 410 may allow for further thermal coupling between the first package component 100 and the thermal coupling structure (e.g., the thermal interface materials, the lid, and the heat sink as illustrated in FIGS. 5A-5B). The metallic layer 410 and the subsequently mounted heat dissipating component may reduce operating temperatures and increases reliability of the resulting package structure. In addition, since the metallic layer 410 is formed after mounting the first package component 100 to the second package component 200, delamination of the metallic layer 410 from the first package component 100 during formation of the first package component 100 is minimized or prevented.

Figure 3A:
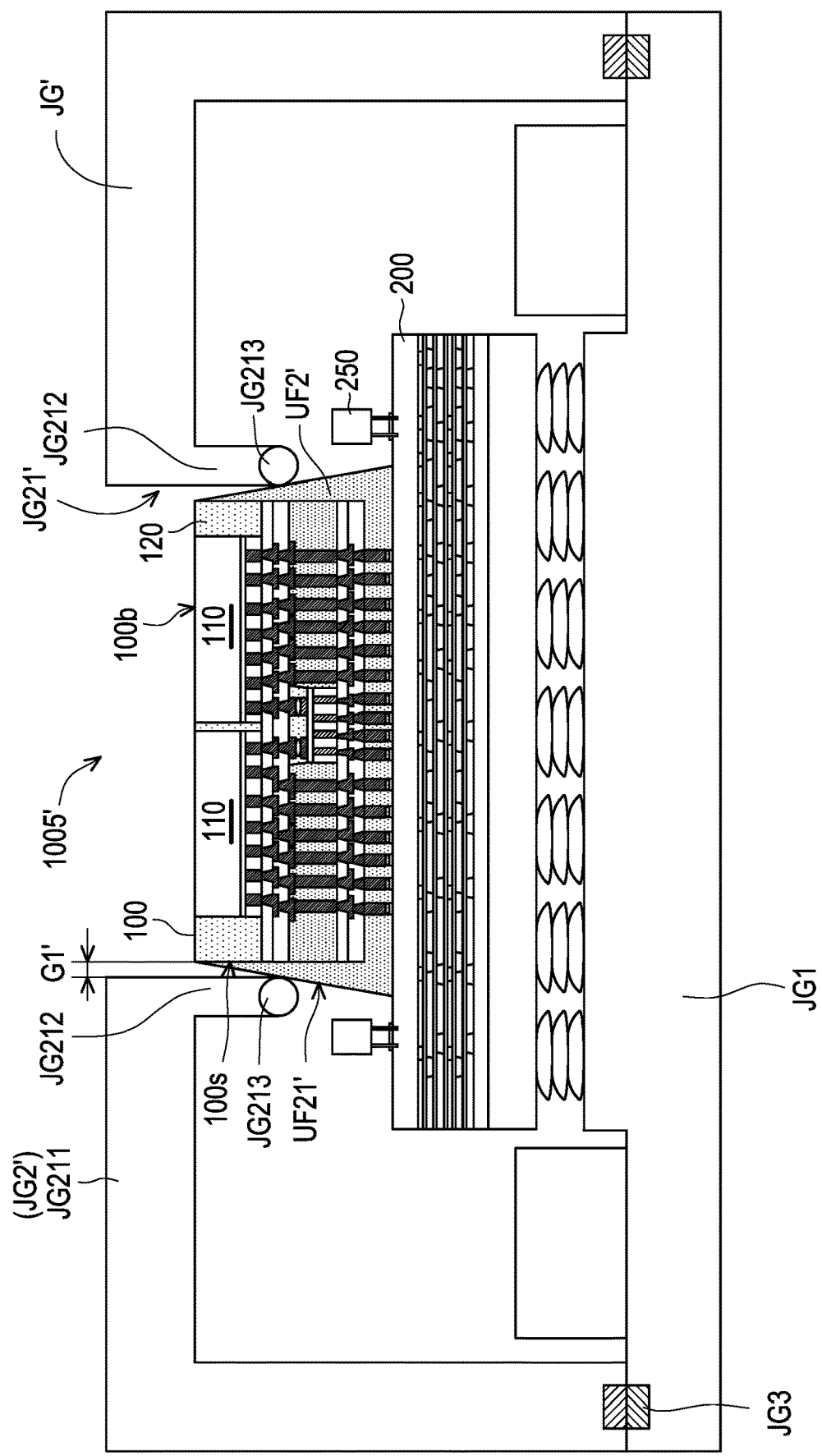
FIGS. 3A-3C are schematic cross-sectional views of various stages of manufacturing a package structure in accordance with some embodiments.
Figure 3B:
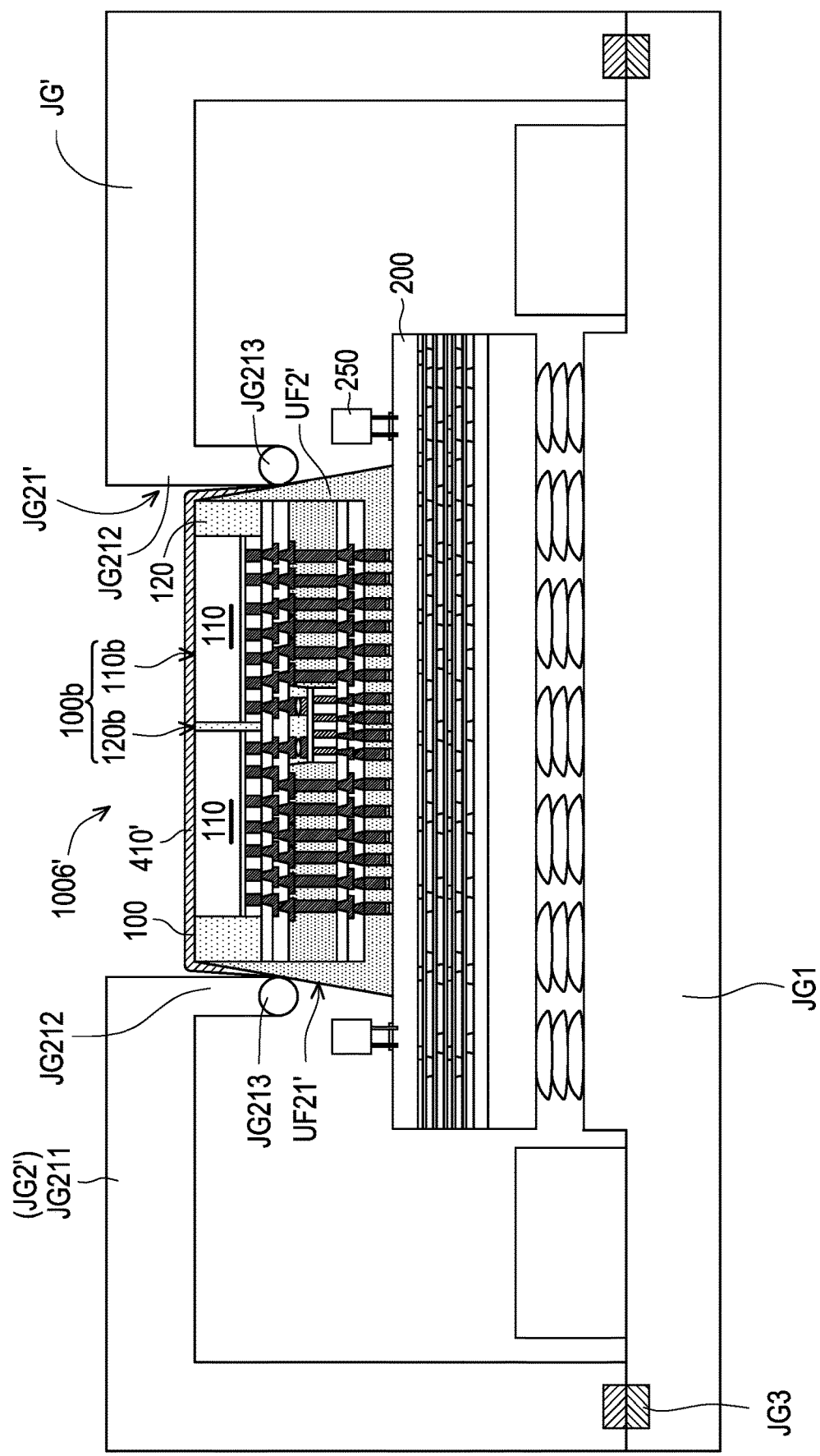
Figure 3C:
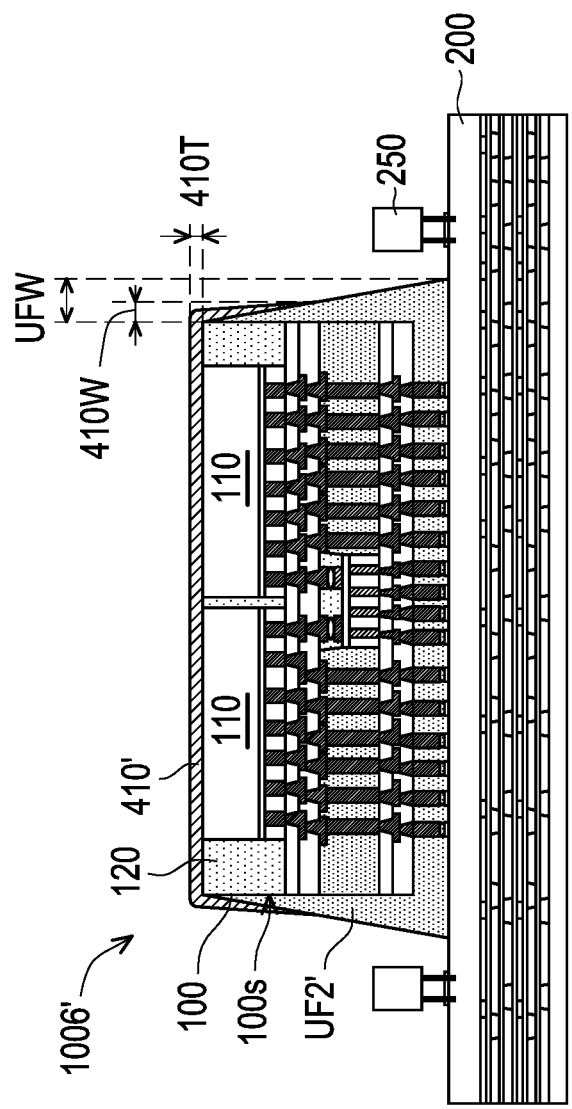
Figure 3D:
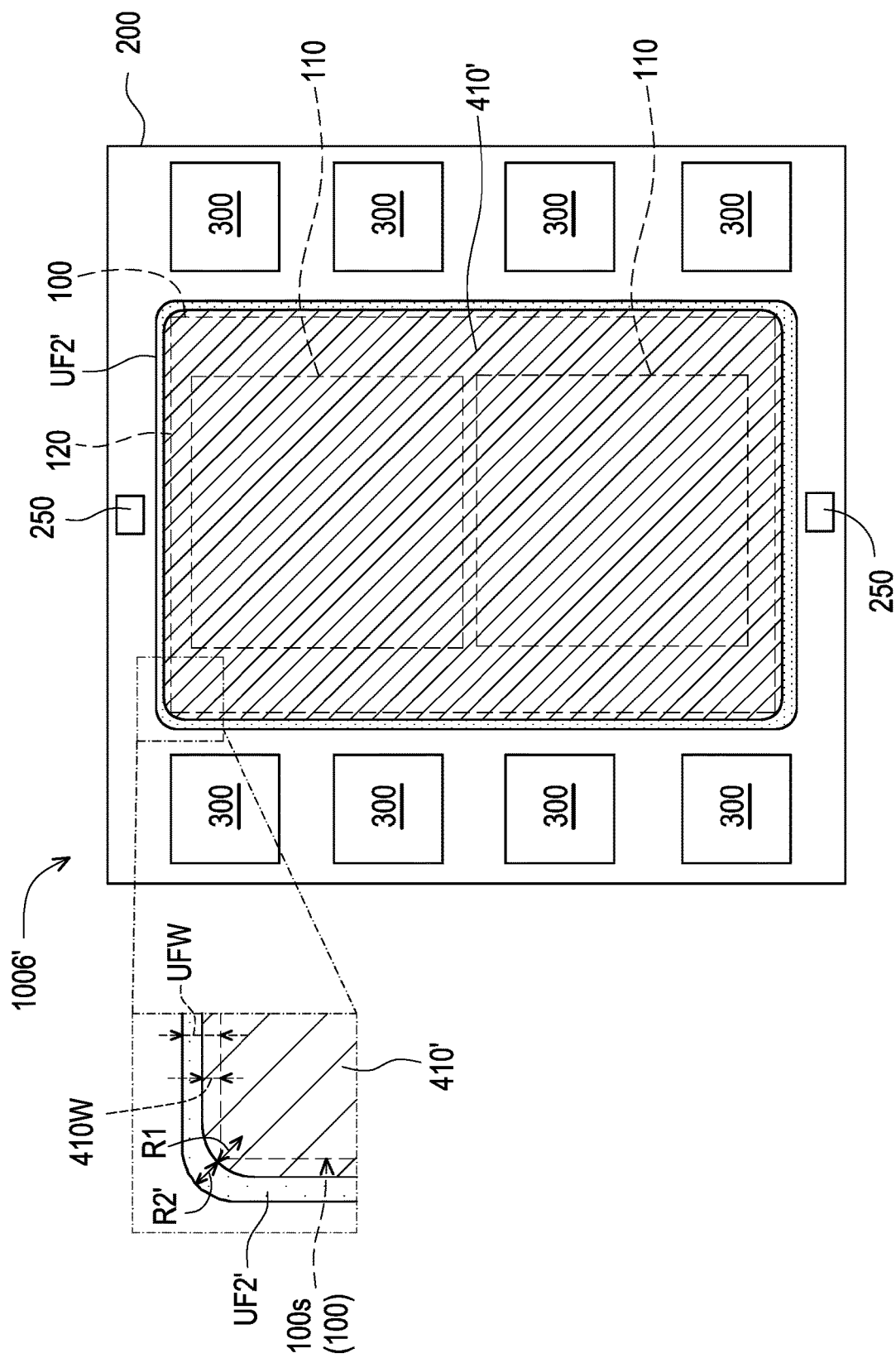
FIG. 3D is a schematic top view of the structure shown in FIG. 3C in accordance with some embodiments.

FIGS. 3A-3C are schematic cross-sectional views of various stages of manufacturing a package structure and FIG. 3D is a schematic top view of the structure shown in FIG. 3C, in accordance with some embodiments. Unless specified otherwise, the materials and the formation methods of the components in these embodiments are essentially the same as the like components, which are denoted by like reference numerals in the embodiments in preceding paragraphs.

Referring to FIG. 3A, the resulting structure 1005' is disposed inside a jig JG'. The resulting structure 1005' and the jig JG' shown in FIG. 3A are similar to the resulting structure 1005 and the jig JG described in FIG. 1F, and thus the detailed descriptions are not repeated for the sake of brevity. The difference between FIGS. 3A and 1F includes that the second underfill layer UF2' covers the entirety of the sidewall 100s of the first package component 100. In addition, the cover portion JG2' of the jig JG' may have a top cover JG211 and a vertical extension JG212 connected to the top cover JG211 and extending along the sidewall 100s of the first package component 100. The vertical extension JG212 may be engaged with the top cover JG211 through any suitable fastener (e.g., screws, bolts, hinges, and/or the like; not shown). Alternatively, the vertical extension JG212 and the top cover JG211 may be integratedly formed in one piece. The window JG21' of the cover portion JG2' may be defined by the vertical extension JG212. For example, the exposed area of the window JG21' of the cover portion JG2' is greater than the surface area of the upper surface 100b of the first package component 100.

In some embodiments, the vertical extension JG212 is provided with a protective member JG213 disposed at the end of the vertical extension JG212. The protective member JG213 may be in physical contact with the second underfill layer UF2'. The protective member JG213 may be made of elastic material that will not damage the second underfill layer UF2' when contacting the second underfill layer UF2'. For example, the protective member JG213 may be (or may include) O-ring, silicone ring or gasket, rubber band, and/or the like. In the illustrated embodiment, the protective member JG213 is in direct contact with the outer surface UF21' of the second underfill layer UF2', and a gap G1' is formed between the sidewall of the vertical extension JG212 and the outer surface UF21' of the second underfill layer UF2'. It should be understood that the applied amount of underfill material may decide the coverage area of the second underfill layer UF2' on the sidewall 100s of the first package component 100. In some embodiments, the second underfill layer UF2' partially covers the sidewall 100s of the first package component 100, and under such scenario, the gap is formed between these exposed sidewalls of the first package component and the sidewall of the vertical extension, as will be described later in FIG. 4A.

Referring to FIG. 3B, a metallic layer 410' is formed on a portion of the first package component 100 that is accessibly exposed by the jig JG' to form the resulting structure 1006'. The material and the forming method of the metallic layer 410' may be similar to those of the metallic layer 410 described in FIG. 1G, and thus the detailed descriptions are omitted. In the illustrated embodiment, the metallic layer 410' is in physical contact with the upper surface 100b of the first package component 100 (e.g., the second surfaces 110b of the first semiconductor dies 110 and the major surface 120b of the first insulating encapsulation 120) and further extends to cover a portion of the outer surface UF21' of the second underfill layer UF2'.

Referring to FIGS. 3C-3D and with reference to FIG. 3B, once the metallic layer 410' is formed, the resulting structure 1006' may be released from the jig JG'. For example, the thickness 410T of a portion of the metallic layer 410' formed on the upper surface 100b of the first package component 100 is in a range of about 0.1 μm to about 5 μm. In the cross-sectional view, the width (or the lateral dimension) 410W of a portion of the metallic layer 410' formed on the second underfill layer UF2' is less than the width (or the lateral dimension) UFW of a portion of the second underfill layer UF2' measured from the sidewall 100s of the first package component 100 to the endpoint of the second underfill layer UF2' formed on the second package component 200. In alternative embodiments, the width 410W of the metallic layer 410' may be substantially equal to the width UFW of the second underfill layer UF2'. In some embodiments, the thickness of the portion of the metallic layer 410' formed on the second underfill layer UF2' decreases from the corner of the first package component 100 to the endpoint of the boundary of the metallic layer 410' on the second underfill layer UF2'.

As shown in the top view of FIG. 3D, the first package component 100 is encircled by the metallic layer 410', and the metallic layer 410' is encircled by the second underfill layer UF2'. That is, the boundary of the metallic layer 410' is interposed between the boundary of the second underfill layer UF2' and the boundary of the first package component 100. The top-view shape of the metallic layer 410' may be similar to that of the metallic layer 410 shown in FIG. 2D, where the radius of curvature R1 of the round corner of the metallic layer 410 may be in a range of about 0.1 mm and about 4 mm. The radius of curvature R2' of the round corner of the underfill layer UF2' may be substantially equal to or greater than the radius of curvature R1. Alternatively, the radius of curvature R2' is less than the radius of curvature R1.

Figure 4A:
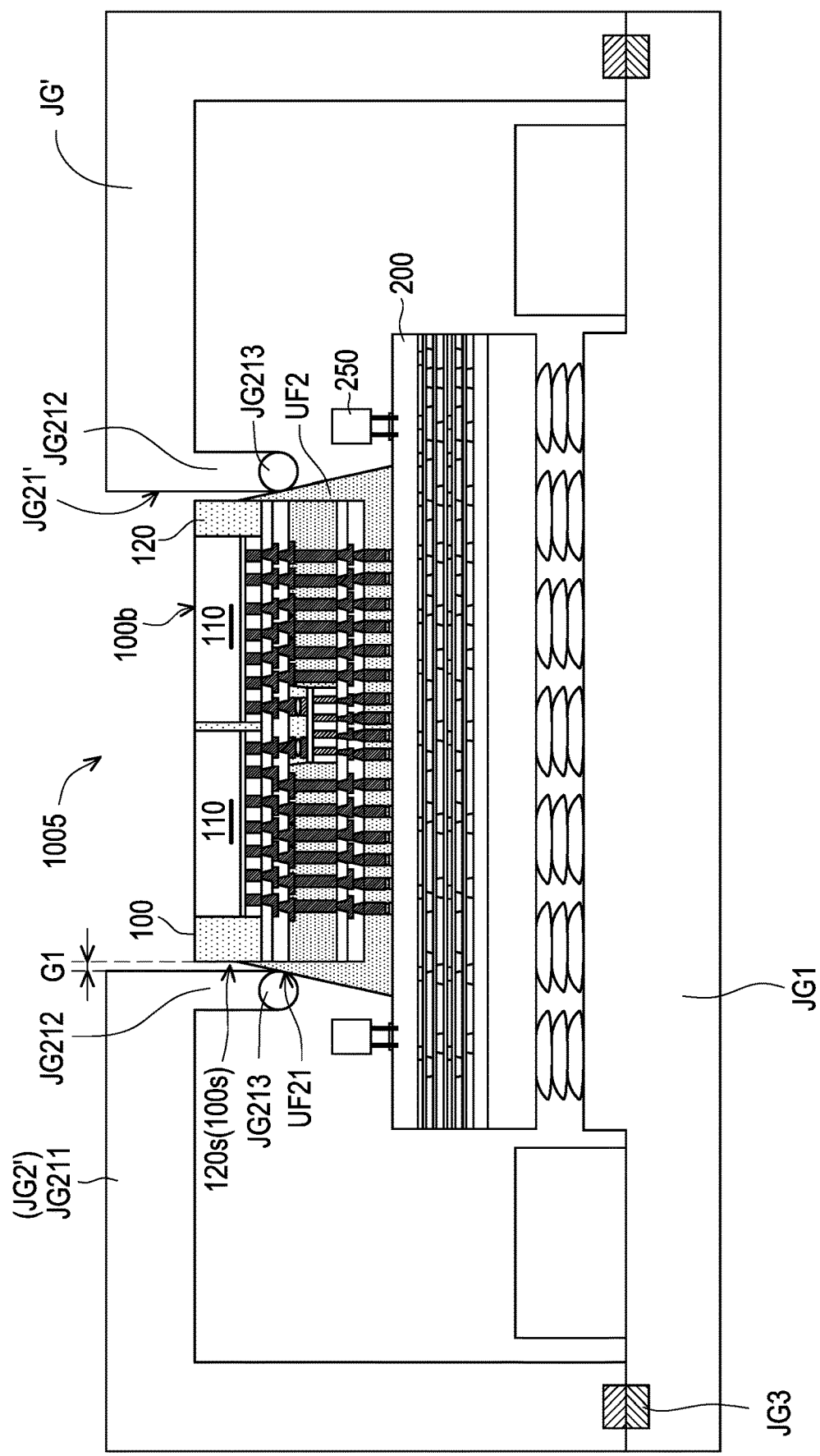
FIGS. 4A-4C are schematic cross-sectional views of various stages of manufacturing a package structure in accordance with some embodiments.
Figure 4B:
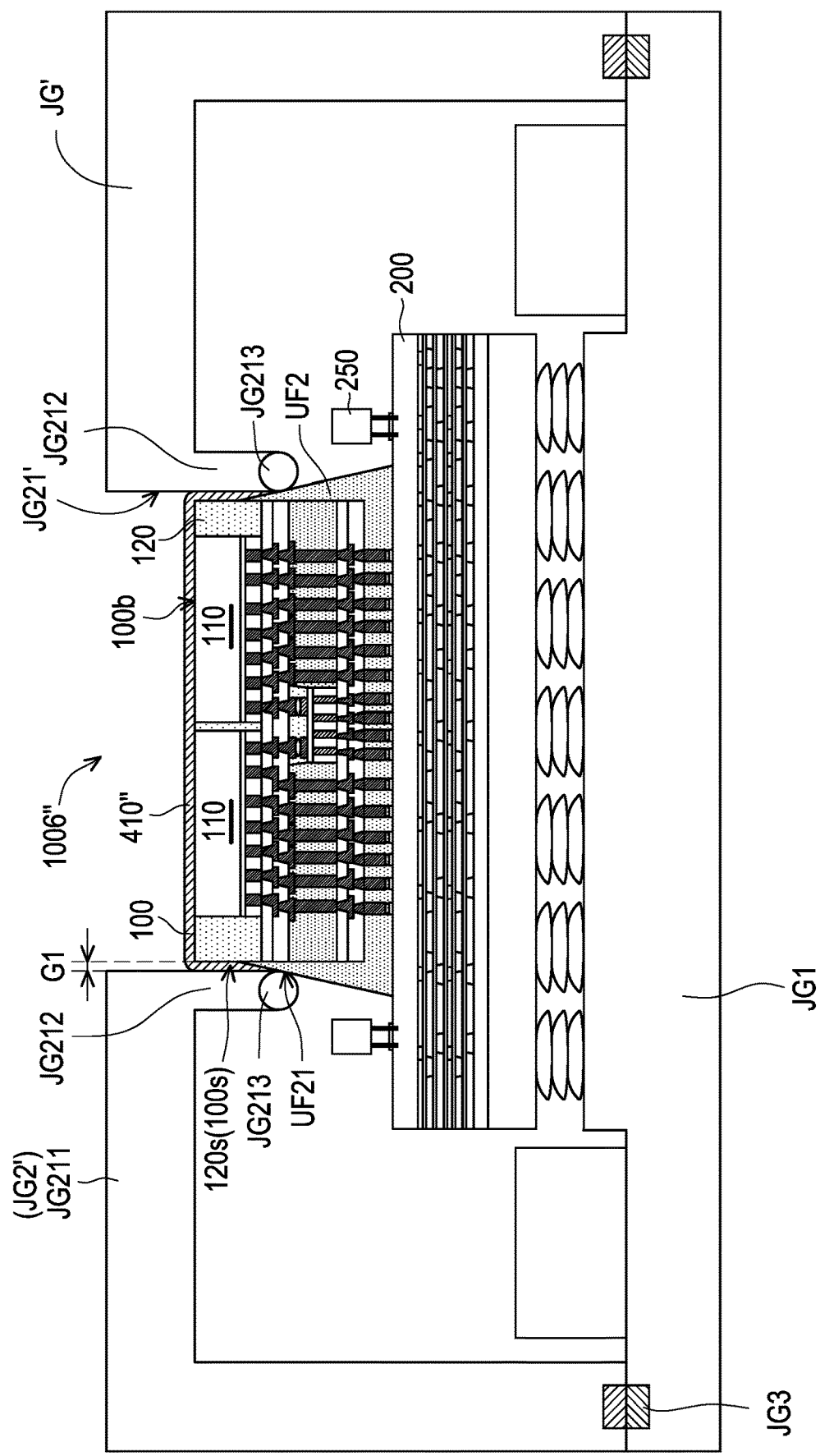
Figure 4C:
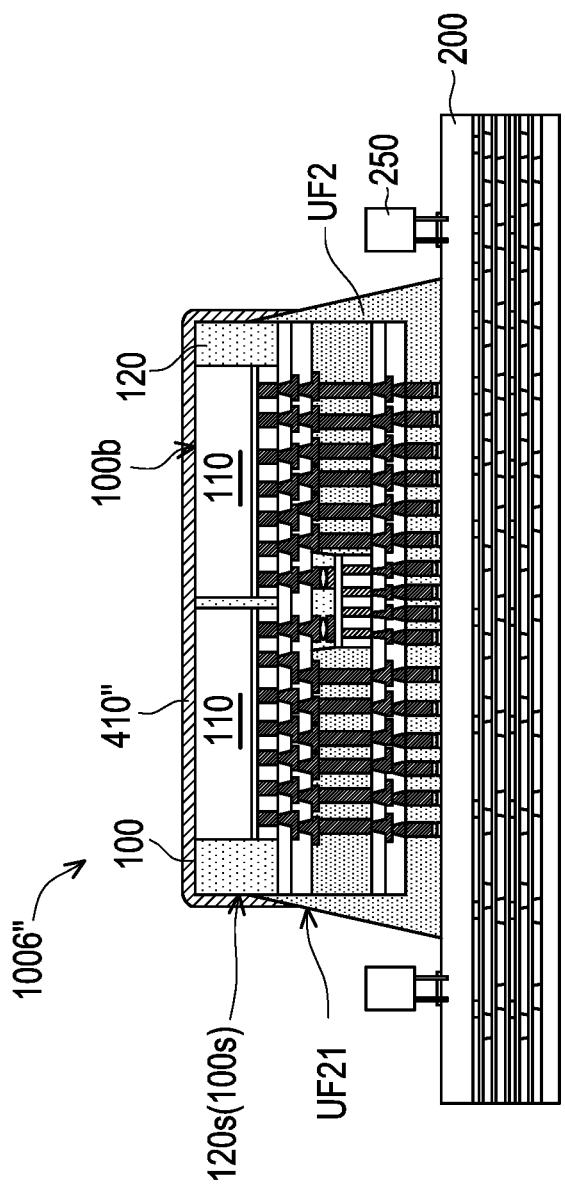

FIGS. 4A-4C are schematic cross-sectional views of various stages of manufacturing a package structure in accordance with some embodiments. The illustrated embodiment shown in FIGS. 4A-4C is similar to the embodiment described in FIG. 3A-3D. Unless specified otherwise, the materials and the formation methods of the components in these embodiments are essentially the same as the like components, which are denoted by like reference numerals in the embodiments in preceding paragraphs.

Referring to FIG. 4A, the resulting structure 1005 is disposed in the jig JG'. The difference between the structure illustrated in FIG. 4A and the structure illustrated in FIG. 3A lies in the second underfill layer UF2. For example, the second underfill layer UF2 of the resulting structure 1005 partially covers the sidewall 100s of the first package component 100. In some embodiments, at least a portion of the sidewall 120s of the first insulating encapsulation 120 is accessibly exposed by the second underfill layer UF2. In some embodiments, the entirety of the sidewall 120s of the first insulating encapsulation 120 is accessibly exposed by the second underfill layer UF2. In some other embodiments, not only the sidewall 120s of the first insulating encapsulation 120, but also the sidewall of the first redistribution structure 130 (or altogether with the sidewall of the second insulating encapsulation 160, or even the sidewall of the second redistribution structure 170) may be accessibly exposed by the second underfill layer UF2. It should be understood that the coverage of the second underfill layer UF2 on the sidewall 100s of the first package component 100 depends on the applied amount of the underfill material when forming the second underfill layer UF2. In the illustrated embodiment, once the protective member JG213 is in direct contact with the outer surface UF21 of the second underfill layer UF2, a gap G1 is formed among the sidewall of the vertical extension JG212, the sidewall 120s of the first insulating encapsulation 120, and the outer surface UF21 of the second underfill layer UF2.

Referring to FIGS. 4B, a metallic layer 410" is formed on a portion of the first package component 100 that is accessibly exposed by the jig JG' to form the resulting structure 1006". The material and the forming method of the metallic layer 410" may be similar to those of the metallic layer 410 described in FIG. 1G, and thus the detailed descriptions are omitted. In the illustrated embodiment, the metallic layer 410" is in physical contact with the upper surface 100b of the first package component 100 (e.g., the second surfaces 110b of the first semiconductor dies 110 and the major surface 120b of the first insulating encapsulation 120) and the sidewall 120s of the first insulating encapsulation 120, and further extends to cover a portion of the outer surface UF21 of the second underfill layer UF2. In alternative embodiments, depending on the coverage area of the second underfill layer UF2, the metallic layer may further physically cover the sidewall of the first redistribution structure 130 (or altogether with the sidewall of the second insulating encapsulation 160, or even the sidewall of the second redistribution structure 170) that is accessibly exposed by the second underfill layer UF2.

Referring to FIG. 4C, once the metallic layer 410" is formed, the resulting structure 1006" may be released from the jig JG'. The resulting structure 1006" is similar to the resulting structure 1006' shown in FIG. 3C, except that the metallic layer 410" may be in direct contact with at least a portion of the sidewall 100s of the first package component 100 (e.g., the sidewall 120s of the first insulating encapsulation 120). It should be understood that the top view of the resulting structure 1006" may be similar to the top view of the resulting structure 1006' described in FIG. 3D, and thus the details thereof are omitted for the sake of brevity.

Figure 5C:
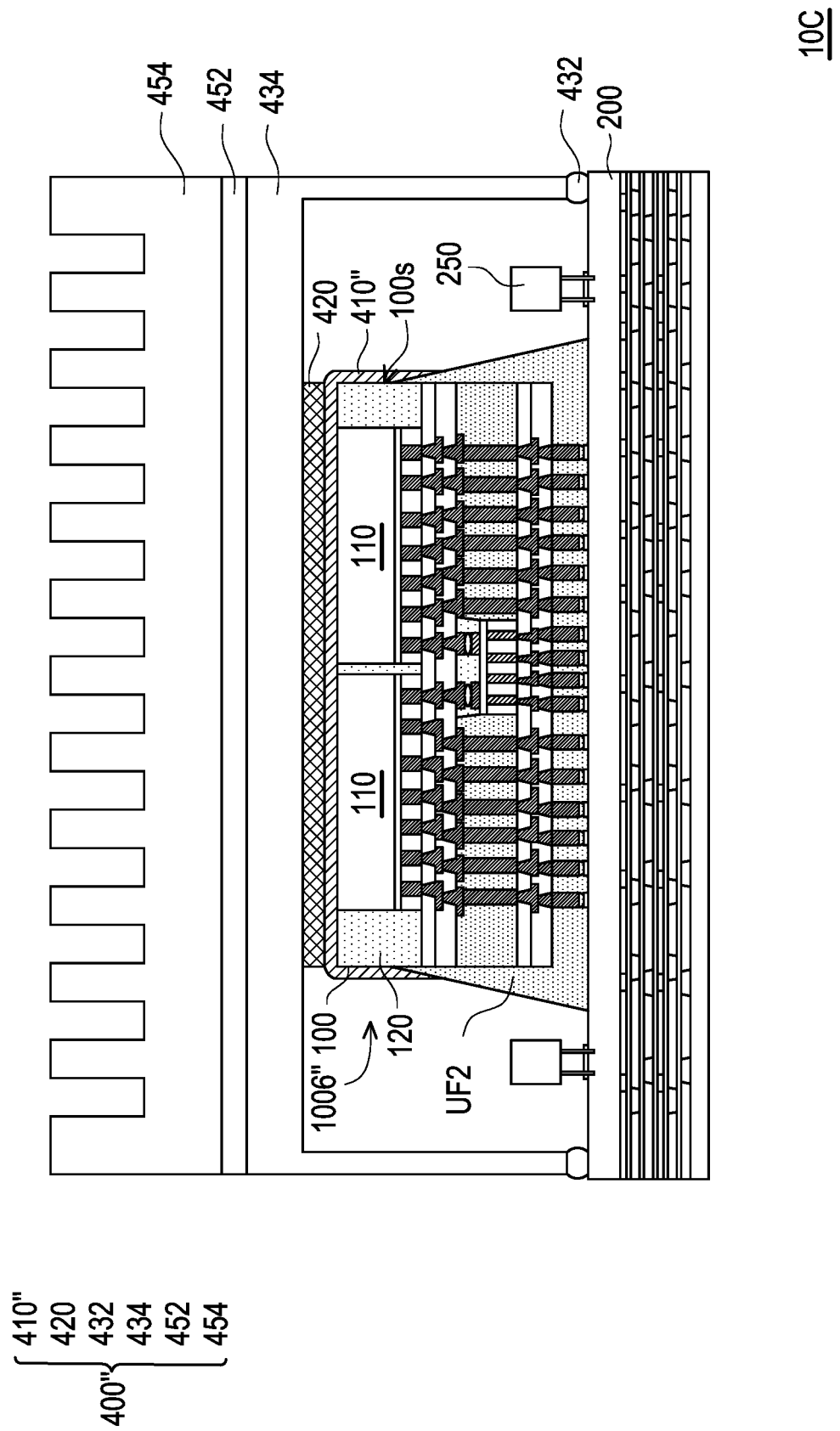

FIG. 5A-5C are schematic cross-sectional views of a package structure in accordance with some embodiments. Unless specified otherwise, the materials and the formation methods of the components in these embodiments are essentially the same as the like components, which are denoted by like reference numerals in the embodiments in preceding paragraphs.

Referring to FIG. 5A and with reference to FIG. 1H, a package structure 10A includes the resulting structure 1006, a first thermal interface material (TIM) layer 420 overlying the metallic layer 410, and a lid 434 attached to the resulting structure 1006 through the first TIM layer 420 and an adhesive layer 432. The first TIM layer 420 may be formed on the first package component 100, and the metallic layer 410 may be embedded in the first TIM layer 420. For example, the first TIM layer 420 covers the top surface 410a and the sidewall 410b of the metallic layer 410, and the first TIM layer 420 may be in direct contact with the peripheral region 100bp of the first package component 100 (e.g., the peripheral region 120bp of the first insulating encapsulation 120). In alternative embodiments, as shown in the dashed boxes in FIG. 5A, the first TIM layer 420 only covers the top surface 410a of the metallic layer 410 without extending to cover the sidewall 410b of the metallic layer 410, and also is not in direct contact with the peripheral region 100bp of the first package component 100. For example, the outer lateral surface of the first TIM layer 420 is a curved (or convex) surface in the cross-sectional view due to the force applied by the lid 434. The first TIM layer 420 may facilitate the thermal coupling between the lid 434 and the first package component 100. For example, the first TIM layer 420 has a good thermal conductivity and may include a polymer with/without thermal conductive fillers. Alternatively, the first TIM layer 420 includes conductive materials (e.g., a metallic-based or solder-based material, or the like).

The lid 434 may have a good thermal conductivity for heat spreading mechanism. The lid 434 and the second package component 200 may form a cavity for accommodating the first package component 100 and other components therein. The adhesive layer 432 may be an epoxy, a silicon resin, glue, or the like, and may (or may not) be capable of transferring heat. The adhesive layer 432 may be deposited at the intended location(s) to allow the lid 434 to be attached onto the second package component 200. In some embodiments, the first TIM layer 420 and the adhesive layer 432 are of the same material and may (or may not) be formed at the same step. Alternatively, the first TIM layer 420 may be applied after (or before) the adhesive layer 432.

The package structure 10A optionally includes a heat sink 454 attached to the lid 434 through a second TIM layer 452. The heat sink 454 may be provided as a fin-type of the heat dissipating component, and the second TIM layer 452 may be the same as or similar to the first Tim layer 420. The metallic layer 410, the first TIM layer 420, the adhesive layer 432, the lid 434, the second TIM layer 452, and the heat sink 454 may be collectively viewed as a thermal coupling structure 400. Although the thermal coupling structure may have more components or less components. For example, the second TIM layer 452 and the heat sink 454 may be omitted. Alternatively, the second TIM layer 452, the adhesive layer 432, and the lid 434 may be omitted, and the heat sink 454 is directly attached to the first TIM layer 420. It should be noted that the dissipating structure may be any tape of heat spreading mechanism which meets heat dissipation requirements of the package structure 10A.

Referring to FIG. 5B and with reference to FIGS. 5A and 3C, a package structure 10B is similar to the package structure 10A described in FIG. 5A, and thus the details descriptions are not repeated for sake of brevity. The difference between the package structures 10B and 10A lies in the resulting structure 1006'. The resulting structure 1006' is as described in FIG. 3C. The first TIM layer 420 of the thermal coupling structure 400' may be formed on the metallic layer 410'. In some embodiments, the first TIM layer 420 physically covers the upper surface of the metallic layer 410' of the thermal coupling structure 400', while a portion of the metallic layer 410' formed on the second underfill layer UF2' is not covered by the first TIM layer 420. That is, a portion of the metallic layer 410' formed on the second underfill layer UF2' is accessibly exposed by the first TIM layer 420.

Referring to FIG. 5C and with reference to FIGS. 5B and 4C, a package structure 10C is similar to the package structure 10B described in FIG. 5B, and thus the details descriptions are not repeated for sake of brevity. The difference between the package structures 10B and 10B lies in the resulting structure 1006". The resulting structure 1006" is as described in FIG. 4C. The first TIM layer 420 of the thermal coupling structure 400" may be formed on the metallic layer 410" of the thermal coupling structure 400". In some embodiments, the first TIM layer 420 physically covers the upper surface of the metallic layer 410", while a portion of the metallic layer 410" formed on the sidewall 100s of the first package component 100 and the second underfill layer UF2 is not covered by the first TIM layer 420. That is, a portion of the metallic layer 410" formed on the sidewall 100s of the first package component 100 and the second underfill layer UF2 is accessibly exposed by the first TIM layer 420. It should be understood that the package structures 10A-10C described above are merely examples, and that variations thereof may be carried out while still remaining within the scope of the claims and disclosure.

In accordance with some embodiments, a package structure includes a first package component, a second package component underlying the first package component, a first underfill layer disposed between the first and second package components, and a metallic layer. The first package component includes semiconductor dies, a first insulating encapsulation laterally encapsulating the semiconductor dies, and a redistribution structure. Each of the semiconductor dies includes a first surface and a second surface opposite to each other, and the redistribution structure underlying the first surfaces of the semiconductor dies and a first surface the first insulating encapsulation is electrically coupled to the semiconductor dies. The second package component is electrically coupled to the semiconductor dies through the redistribution structure, the first underfill layer extends to cover a sidewall of the first package component, and the metallic layer overlies the second surfaces of the semiconductor dies and a second surface of the first insulating encapsulation. The first surface and the second surface of the first insulating encapsulation are opposite to each other, and a peripheral region of the second surface of the first insulating encapsulation is accessibly exposed by the metallic layer.

In accordance with some embodiments, a package structure includes a first package component, a second package component underlying the first package component, an underfill layer disposed between the first and second package components, and a metallic layer. The first package component includes semiconductor dies, an insulating encapsulation laterally encapsulating the semiconductor dies, and a redistribution structure. Each of the semiconductor dies comprising a first surface and a second surface opposite to each other, and the redistribution structure underlying the first surfaces of the semiconductor dies and a first surface the insulating encapsulation is electrically coupled to the semiconductor dies. The second package component is electrically coupled to the semiconductor dies through the redistribution structure, the underfill layer extends to cover a sidewall of the first package component, and the metallic layer overlying the second surfaces of the semiconductor dies and a second surface of the insulating encapsulation further extends to cover the underfill layer.

In accordance with some embodiments, a manufacturing method of a package structure includes at least the following steps. A first package component is formed, where the first package component includes semiconductor dies, a first insulating encapsulation laterally covering by the semiconductor dies, and a redistribution structure formed on a first surface of the first insulating encapsulation and first surfaces of the semiconductor dies. The first package component is coupled to a second package component. An underfill layer is formed between the first package component and the second package component, where the underfill layer extends to cover a sidewall of the first package component. A metallic layer is formed on second surfaces of the semiconductor dies and a second surface of the first insulating encapsulation by using a jig, where a window of the jig accessibly exposes the second surfaces of the semiconductor dies and the second surface of the first insulating encapsulation surrounding the second surfaces of the semiconductor dies, and a peripheral region of the second surface of the first insulating encapsulation is shielded by the jig.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package structure, comprising:
a first package component comprising:
semiconductor dies, each of the semiconductor dies comprising a first surface and a second surface opposite to each other;
a first insulating encapsulation laterally encapsulating the semiconductor dies; and
a redistribution structure underlying the first surfaces of the semiconductor dies and a first surface the first insulating encapsulation, and the redistribution structure being electrically coupled to the semiconductor dies; and
a second package component underlying the first package component and electrically coupled to the semiconductor dies through the redistribution structure;
a first underfill layer disposed between the first and second package components and extending to cover a sidewall of the first package component; and
a metallic layer overlying the second surfaces of the semiconductor dies and a second surface of the first insulating encapsulation, wherein the first surface and the second surface of the first insulating encapsulation are opposite to each other, and a peripheral region of the second surface of the first insulating encapsulation is accessibly exposed by the metallic layer, wherein in a top view, the metallic layer comprises a rounded corner that corresponds to a corner at the intersection between two adjacent sides of the first insulating encapsulation, and a width of the peripheral region between sides of the metallic layer and the first insulating encapsulation is less than a width of the peripheral region between the corner of the first insulating encapsulation and the rounded corner of the metallic layer.

2. The package structure of claim 1, wherein in the top view, a boundary of the metallic layer is encircled by a boundary of the first package component, and the boundary of the first package component is encircled by a boundary of the first underfill layer.

3. The package structure of claim 1, wherein the width of the peripheral region between the sides of the metallic layer and the first insulating encapsulation is greater than a thickness of the metallic layer.

4. The package structure of claim 1, wherein a top-view shape of the metallic layer is different from that of the first insulating encapsulation.

5. The package structure of claim 1, wherein the first surfaces of the semiconductor dies and the first surface the first insulating encapsulation are substantially leveled, and the second surfaces of the semiconductor dies and the second surface the first insulating encapsulation are substantially leveled.

6. The package structure of claim 1, wherein the first package component further comprises:
a bridge die underlying the redistribution structure and below adjacent two of the semiconductor dies, the bridge die being electrically coupled to the adjacent two of the semiconductor dies through the redistribution structure;
a second insulating encapsulation underlying the redistribution structure and covering the bridge die; and
through interlayer vias penetrating through the second insulating encapsulation and electrically coupled to the semiconductor dies through the redistribution structure.

7. The package structure of claim 6, wherein the first package component further comprises:
a second underfill layer disposed between the bridge die and the redistribution structure, wherein a tapering direction of the second underfill layer is opposite to that of the first underfill layer in a cross-sectional view.

8. The package structure of claim 1, further comprising:
a thermal interface material layer overlying the metallic layer and physically covering the peripheral region of the first insulating encapsulation; and
a heat dissipating component thermally coupled to the first package component through the metallic layer and the thermal interface material layer.

9. A package structure, comprising:
a first package component comprising:
   semiconductor dies, each of the semiconductor dies comprising a first surface and a second surface opposite to each other;
   an insulating encapsulation laterally encapsulating the semiconductor dies; and
   a redistribution structure underlying the first surfaces of the semiconductor dies and a first surface the insulating encapsulation, and the redistribution structure being electrically coupled to the semiconductor dies;
a second package component underlying the first package component and electrically coupled to the semiconductor dies through the redistribution structure;
an underfill layer disposed between the first and second package components and extending to cover a sidewall of the first package component; and
a metallic layer overlying the second surfaces of the semiconductor dies and a second surface of the insulating encapsulation, and the metallic layer further extending to cover the underfill layer wherein the metallic layer is in physical contact with a sidewall of the insulating encapsulation of the first package component and extends to be in physical contact with an outer surface of the underfill layer.

10. The package structure of claim 9, wherein in a top view, a boundary of the first package component is encircled by a boundary of the metallic layer, and the boundary of the metallic layer is encircled by a boundary of the underfill layer.

11. The package structure of claim 9, wherein in a top view, the metallic layer comprises a rounded corner that corresponds to a rounded corner of the underfill layer.

12. The package structure of claim 9, wherein in a cross-sectional view, a width of the underfill layer measured from a sidewall of the first package component to an endpoint of the underfill layer on the second package component is greater than a width of the metallic layer measured from the sidewall of the first package component to an endpoint of the metallic layer on the underfill layer.

13. The package structure of claim 9, wherein in a cross-sectional view, a thickness of the metallic layer overlying the underfill layer decreases from a corner of the first package component to an endpoint of the metallic layer on the underfill layer.

14. The package structure of claim 9, wherein the underfill layer covers an entirety of a sidewall of the insulating encapsulation.

15. The package structure of claim 9, wherein the first surfaces of the semiconductor dies and the first surface the first insulating encapsulation are substantially leveled.

16. The package structure of claim 9, further comprising:
a thermal interface material layer disposed over the first package component and overlying the metallic layer, and the thermal interface material layer accessibly exposing at least a portion of the metallic layer on the underfill layer; and
a heat dissipating component thermally coupled to the first package component through the metallic layer and the thermal interface material layer.

17. A package structure, comprising:
a first package component comprising:
   semiconductor dies;
   an insulating encapsulation laterally encapsulating the semiconductor dies; and
a second package component underlying the first package component and electrically coupled to the semiconductor dies;
an underfill layer disposed between the first and second package components; and
a metallic layer overlying rear surfaces of the semiconductor dies and a surface of the insulating encapsulation, wherein the surface of the insulating encapsulation and the rear surfaces of the semiconductor dies are substantially leveled with one another, and a peripheral region of the surface of the insulating encapsulation is accessibly exposed by the metallic layer, wherein in a top view, the metallic layer comprises a rounded corner that corresponds to a rounded corner of the underfill layer.

18. The package structure of claim 17, wherein in the top view, a boundary of the metallic layer is encircled by a boundary of the first package component, and the boundary of the first package component is encircled by a boundary of the underfill layer.

19. The package structure of claim 17, further comprising:
a thermal interface material layer overlying the metallic layer and the insulating encapsulation; and
a heat dissipating component thermally coupled to the first package component through the metallic layer and the thermal interface material layer.

20. The package structure of claim 17, wherein in the top view, a curvature of the rounded corner of the metallic layer is different from a curvature of the rounded corner of the underfill layer.

* * * * *